US012700857B1

(12) United States Patent
Higgins

(10) Patent No.: US 12,700,857 B1
(45) Date of Patent: Aug. 4, 2026

(54) METHOD AND APPARATUS FOR AN ASYMMETRIC RF SWITCH

(71) Applicant: Otava, Inc., Moorestown, NJ (US)

(72) Inventor: Thomas Higgins, Moorestown, NJ (US)

(73) Assignee: Otava RF, Inc., Moorestown, NJ (US)

( * ) Notice: Subject to any disclaimer, the term of this patent is extended or adjusted under 35 U.S.C. 154(b) by 0 days.

(21) Appl. No.: 18/530,215

(22) Filed: Dec. 6, 2023

Related U.S. Application Data

(60) Provisional application No. 63/434,600, filed on Dec. 22, 2022.

(51) Int. Cl.
 *H03K 17/06* (2006.01)
 *H03K 17/10* (2006.01)
(52) U.S. Cl.
 CPC ......... *H03K 17/063* (2013.01); *H03K 17/102* (2013.01); *H03K 2017/066* (2013.01)
(58) Field of Classification Search
 CPC ............... H03K 17/063; H03K 17/102; H03K 2017/066
 See application file for complete search history.

(56) References Cited

U.S. PATENT DOCUMENTS

| | | | |
|---|---|---|---|
| 8,482,360 B2 * | 7/2013 | Chang ................. | H03K 17/693 |
| | | | 333/103 |
| 9,397,656 B2 * | 7/2016 | Dribinsky ............ | H03K 17/284 |
| 10,637,526 B2 * | 4/2020 | Lu ........................ | H03K 17/693 |

* cited by examiner

*Primary Examiner* — Ryan Johnson
*Assistant Examiner* — Colleen J O Toole
(74) *Attorney, Agent, or Firm* — Kaplan IP Law, PLLC; Jonathan T. Kaplan

(57) ABSTRACT

An asymmetric RF switch for micro or millimeter waves, with each shunt or passthrough stack having two or more series FETs of approximately same channel width. A first lowest loss path, having only transmission line, passing through a second node, between common and first selectable ports. A second path, between the common and second selectable ports, passing through the second node, a pass-through stack, and a first node. Isolating the second selectable port from the first path by an on state of a second shunt stack connected to the first node, and an off state of the passthrough stack. Isolating the first selectable port from the second path by having an on state of the first shunt stack, or a path length, between the second node and the ground of a first shunt stack coupled to the second node, one quarter the wavelength of signals over the second path.

7 Claims, 18 Drawing Sheets

FIGURE 3

Switch 300 is prior art (Transmit) Port 112

Common Port 110

(Receive) Port- 111

322 λ/4 Line

321 λ/4 Line

Switch 700 is prior art (Transmit) Port 112

Figure 7:
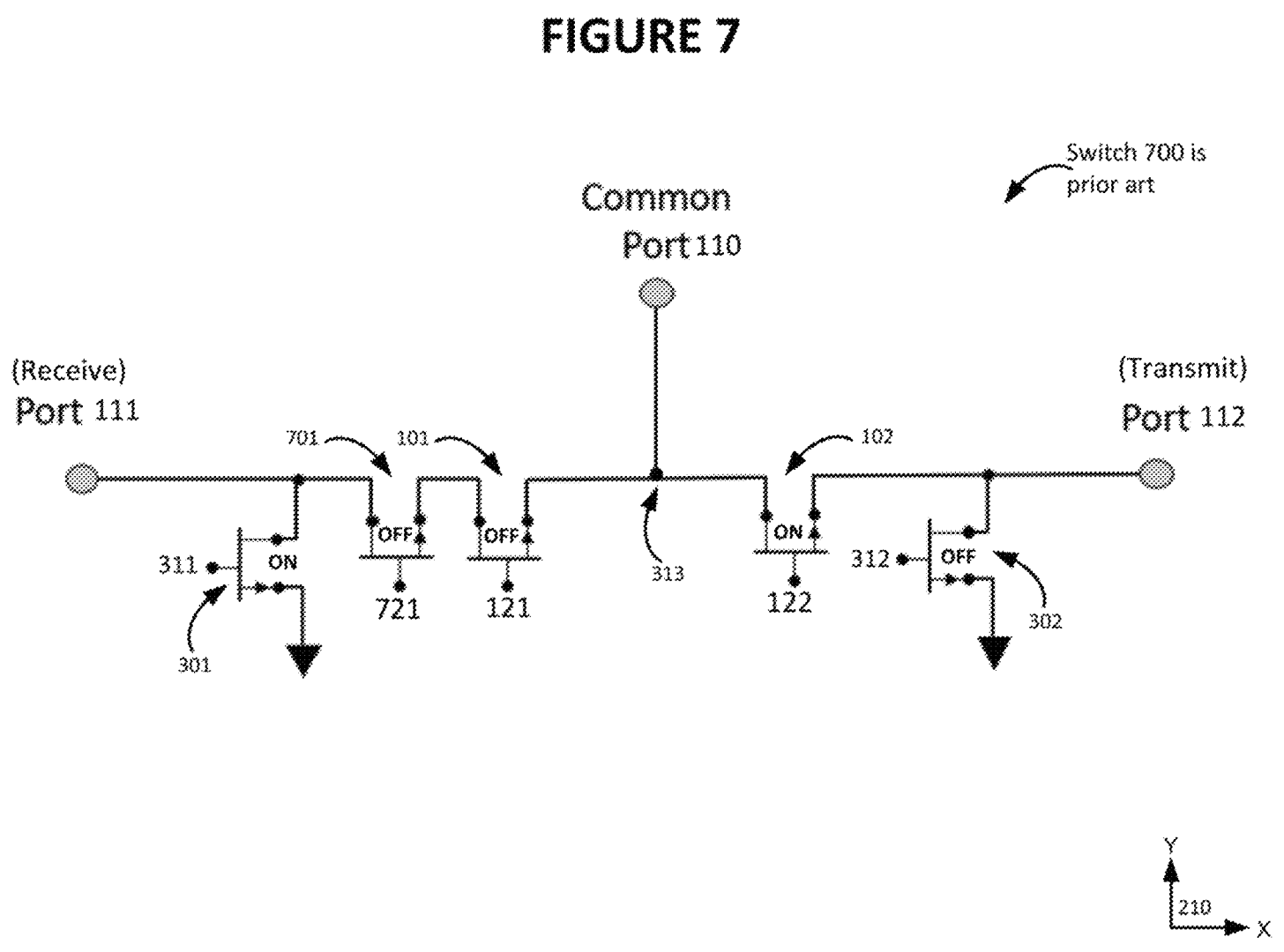

(Receive) Port 111

Common Port 110

302

OFF

312

102

ON

122

313

OFF

121

OFF

Figure 8A:
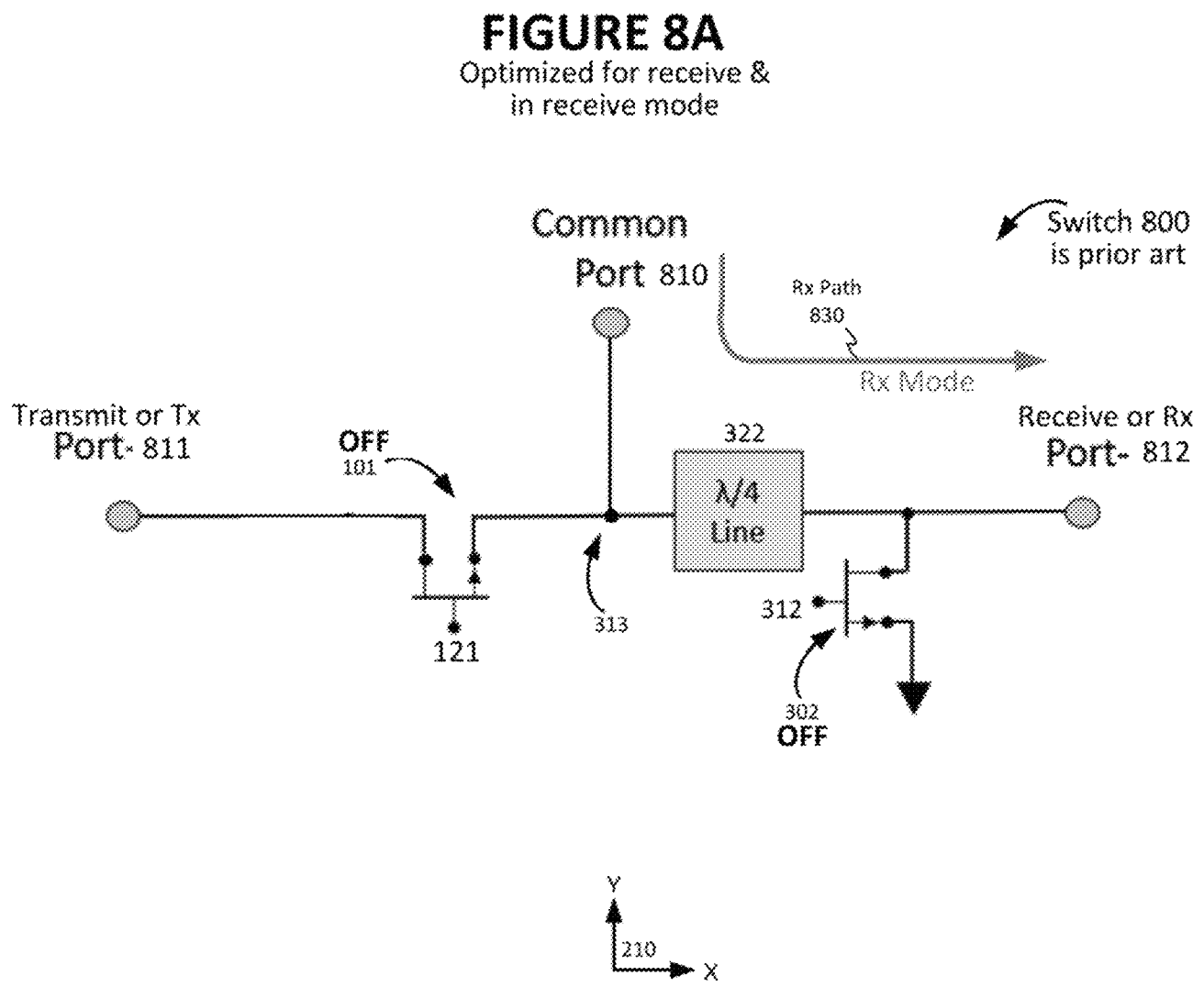

Optimized for receive & in receive mode

Switch 800 is prior art

Common Port 810

Rx Path 830

Rx Mode

322 λ/4 Line

313

OFF 101

121

Transmit or Tx Port- 811

312

302 OFF

Receive or Rx Port- 812

210

Y X

Optimized for transmit
& in transmit mode

1st Asymmetric Arch: optimized for Tx & stacks set for Tx Mode

1st _Asymmetric Arch:_
_optimized for Tx but_
_stacks set for Rx Mode_

FIGURE 10C
1st Asymmetric Arch:
Priority Signal assigned
to Port 1041

2nd Asymmetric Arch:
optimized for Tx &
stacks set for Tx Mode

2nd Asymmetric Arch:
optimized for Tx but
stacks set for Rx Mode

2nd Asymmetric Arch:
optimized for Rx and
stacks set for Rx Mode

2nd *Asymmetric Arch*:
optimized for Rx but
stacks set for Tx Mode

FIGURE 13

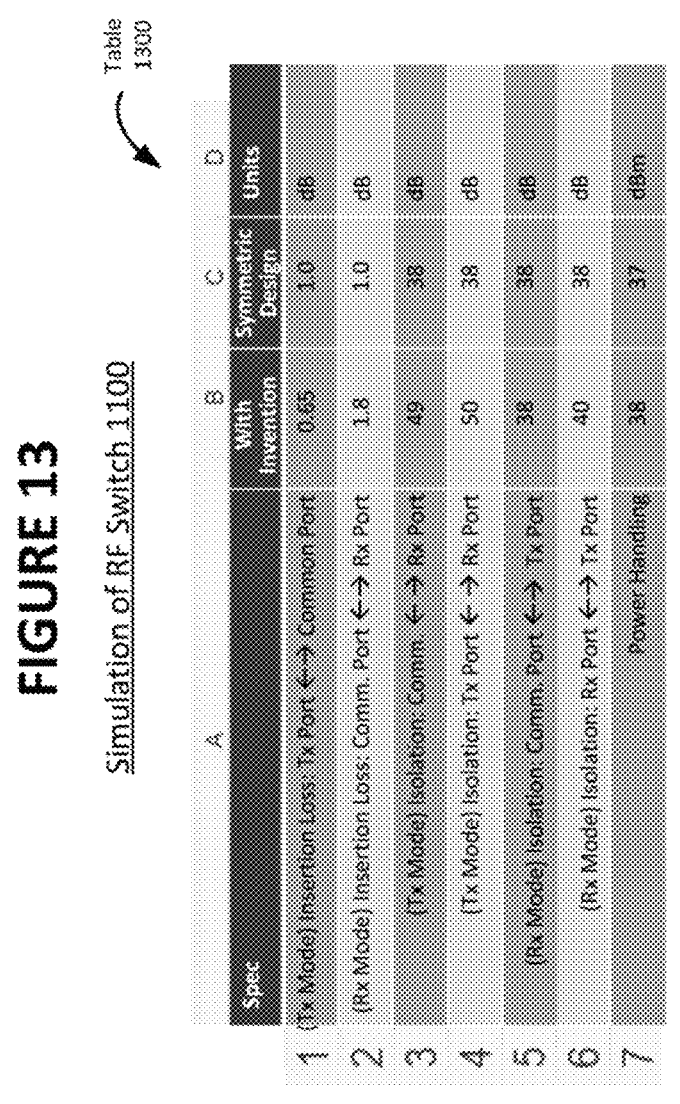

Simulation of RF Switch 1100

Table 1300

| | A Spec | B With Insertion | C Symmetric Design | D Units |
|---|---|---|---|---|
| 1 | (Tx Mode) Insertion Loss: Tx Port ←→ Common Port | 0.65 | 1.0 | dB |
| 2 | (Rx Mode) Insertion Loss: Comm. Port ←→ Rx Port | 1.8 | 1.0 | dB |
| 3 | (Tx Mode) Isolation: Comm ←→ Rx Port | 49 | 38 | dB |
| 4 | (Tx Mode) Isolation: Tx Port ←→ Rx Port | 50 | 38 | dB |
| 5 | (Rx Mode) Isolation: Comm Port ←→ Tx Port | 38 | 38 | dB |
| 6 | (Rx Mode) Isolation: Rx Port ←→ Tx Port | 40 | 38 | dB |
| 7 | Power Handling | 38 | 37 | dBm |

METHOD AND APPARATUS FOR AN ASYMMETRIC RF SWITCH

As provided for under 35 U.S.C. § 119(e), this patent claims benefit of the filing date of the following U.S. Provisional Patent Application, herein incorporated it by reference in its entirety:

"Method and Apparatus for An Asymmetric RF Switch," Application No. 63/434,600, Confirmation No. 1083, and filed 2022 Dec. 22 (y/m/d).

FIELD OF THE INVENTION

The present invention relates generally to the field of providing switches for RF (Radio Frequency) signals, and, more particularly, to providing asymmetric switches.

BACKGROUND OF THE INVENTION

The general idea of using FET's (or other types of transistors) for the purpose of forming an RF switch is known. Among many other potential uses, an RF switch can allow a single antenna element to switch between transmitting a wireless signal or receiving a wireless signal.

For example, a particularly simple RF switch, composed of two N-channel Field Effect Transistors (FET's), is shown in FIG. 1A. RF switch 100 is composed of FET's 101 and 102, where the source of FET 101 is coupled to the drain of FET 102 to form a Common Port 110. The drain of FET 101 is used as a first port, Port 111, while the source of FET 102 is used as a second port, Port 112. The Common Port can be coupled to an antenna 130, capable of either send or receive.

As indicated in FIG. 1A, Port 112 can be used as a "Transmit" port. A signal to be transmitted (by antenna 130) can be input at Port 112, pass-through FET 102, and exit the RF switch at Common Port 110. For switch 100, this is labeled as Tx Path 140. The activation of pass-through FET 102 can be accomplished by applying an appropriate "on" signal to FET 102's gate terminal 122. At the same time as a signal passes from port 112 to port 110, port 111 can be disabled (or isolated from Tx Path 140) by application of an "off" signal to gate terminal 121 of FET 101.

As also indicated in FIG. 1A, Port 111 can be used as a "Receive" port. A signal received, by antenna 130 coupled to Common Port 110, can pass-through FET 101, and exit the RF switch at Receive Port 111. For switch 100, this is labeled as Rx Path 141. The activation of pass-through FET 101 can be accomplished by applying an appropriate "on" signal to FET 101's gate terminal 121. At the same time as a signal passes from port 110 to port 111, port 112 can be disabled (or isolated) by application of an "off" signal to gate terminal 122 of FET 102.

In addition to being categorized as a FET-based RF switch, if we assume FET's 101 and 102 are the same, FIG. 1A is also a symmetric design, since each of port 111 and 112 is supported by the same hardware (i.e., one of two, identical, pass-through FET's). RF switch 100 can also be categorized as a Single Pole Double Throw (SPDT) switch, since the single "pole" of Common Port 110, can be "thrown" (or connected to) each of Port 111 or Port 112. For an example of FIG. 1A, in the prior art, one can refer to the following reference: Devlin, "The Design of Integrated Switches and Phase Shifters," 1999, and especially FIG. 3 of Devlin.

FIG. 1A is just one example of how an RF switch can be used. FIG. 1B depicts the same RF switch 100 as FIG. 1A, except the environment for switch 100 is changed. In FIG.

1B, rather than a single antenna 130, two separate antennas (i.e., antenna 131 for receiving signals, and antenna 132 for transmit) are used. This causes the Rx and Tx Paths of FIG. 1B (respectively, 143 and 142) to be the opposite direction of the corresponding paths of FIG. 1A (respectively, 141 and 140).

While the design of RF switch 100 has the advantage of simplicity, it can also provide poor performance at higher frequencies (e.g., microwave or millimeter wave). This is because nothing has been done to lessen the capacitance of either FET.

The capacitance issue of the FET is what led to designs like RF switch 200 FIG. 2. As can be seen, RF switch 200 is a superset of components when compared to RF switch 100. In particular, RF switch 200 also includes FET 101 and FET 102, and the ports provide the same basic functionality, as indicated by their being labeled the same as RF switch 100. The main difference is that FET 101 has been augmented with two additional FET's, 201 and 203, connected in series, and that FET 102 has two additional FET's, 202 and 204, connected in series.

It is well known that when n capacitors are connected in series, each of capacitance C, the net capacitance of the series is lower (i.e., C/n). Therefore, for example, assume each of FET's 101, 201, and 203 has the same capacitance C. In comparison to FIG. 1, where the capacitance between ports 111 and 110 is C, in FIG. 2 it is reduced to C/3. The same capacitance reduction, when transitioning from the design of FIG. 1 to FIG. 2, applies to the capacitance between ports 110 and 112.

The series connection of transistors, such as FET's, can be referred to as a "stack." A series of n transistors can be used to pass-through a signal. This means a signal input at one side of the series is output at the other side. This can be referred to as a "pass-through stack," "PT stack," or "PT n stack" Therefore, FET's 101, 201, and 203, can be referred to as a PT 3 stack, and so can FET's 102, 202, and 204. The x axis, of axes 210, can be used to distinguish leftward and rightward in a figure (e.g., FIG. 2, proceeding from smaller to larger values of x is rightward while proceeding in the opposite direction is leftward). For purposes of distinguishing between the two pass-through 3 stacks, the stack comprised of FET's 101, 201, and 203 can be referred to as the "left" pass-through 3 stack, and the stack comprised of FET's 102, 202, and 204 can be referred to as the "right" pass-through 3 stack, in relation to the X axis.

Alternatively, the left pass-through 3 stack can be referred to as the stack between ports (or nodes) 111 and 110, while the right pass-through 3 stack can be referred to as the stack between ports (or nodes) 110 and 112.

For an example of FIG. 2, in the prior art, one can refer to the following reference: Devlin, "The Design of Integrated Switches and Phase Shifters," 1999, and especially FIG. 20 of Devlin. The use of pass-through n stacks (for n>1) is better than the design of FIG. 1, by reducing FET capacitance and increasing power handling (because a FET series can handle higher voltages than a single FET). However, having a signal pass through multiple series transistors increases insertion loss, and the design of FIG. 2 is still known to have high-frequency limitations.

Figure 3:
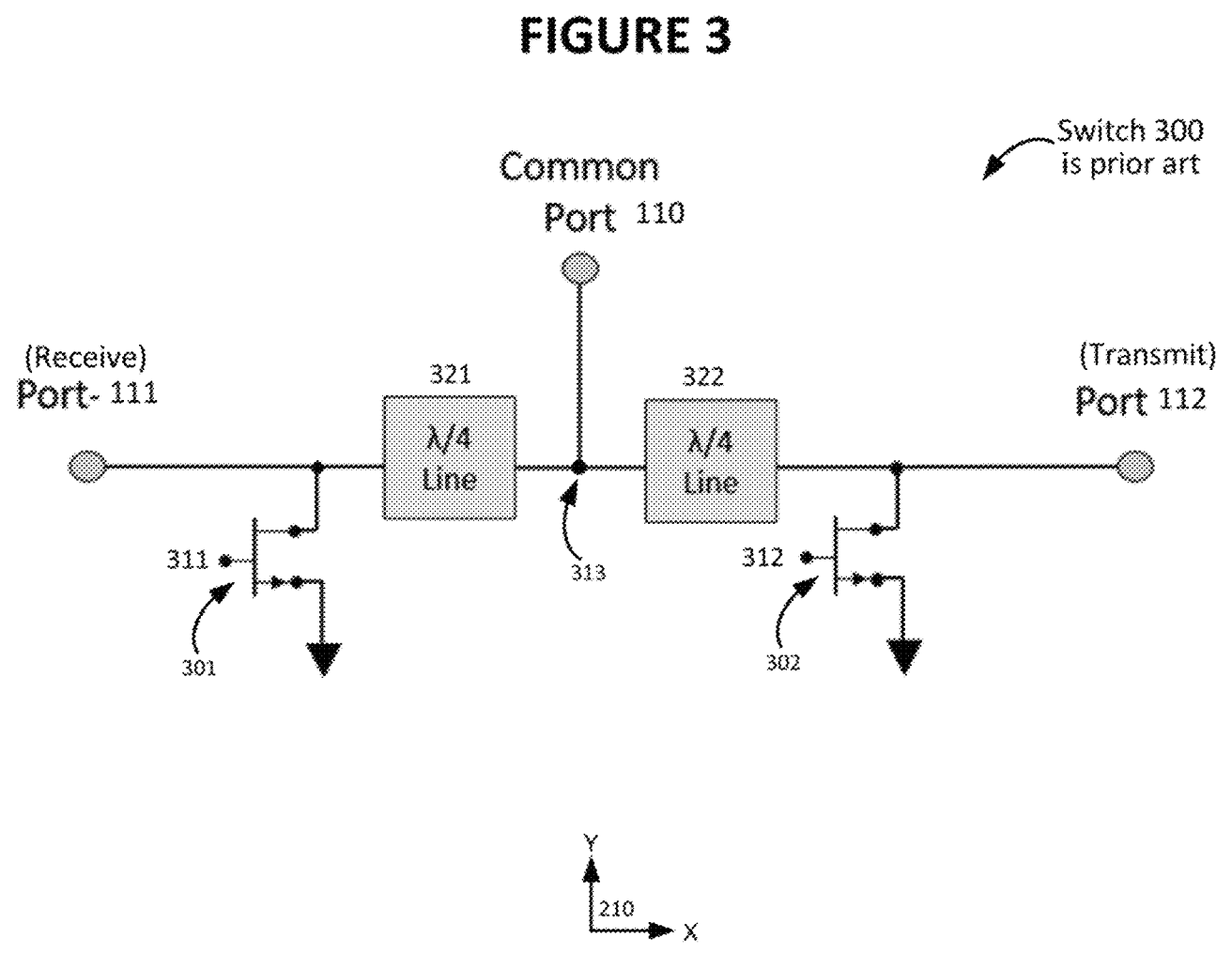

FIG. 3 depicts another approach to achieving an RF switch 300 with similar basic functionality to FIG. 1. This similar functionality is indicated by the ports of RF switch 300 having the same labeling (i.e., Port 111, Common Port 110, and Port 112) as FIG. 1. However, switch 100 (and switch 200) is based on the use of a FET as a pass-through device, while for switch 300 each FET is used as a "shunt"

(meaning pass-through functionality is used to route a signal to a power rail; most commonly ground).

To use RF switch 300 in transmit mode (or Transmit Mode), such that a signal input at port 112 exits through port 110 (and not port 111), shunt transistor 302 is turned OFF (by application of an "off" signal at its gate terminal 312), and shunt transistor 301 is turned ON (by application of an "on" signal at its gate terminal 311). In this mode, λ/4 boxes 321 and 322 act as follows.

λ/4 box 322 just acts as a wire, routing input signal at port 112 to node 313.

At node 313, a first part of the input signal travels directly to port 110 for transmission by an antenna attached to port 110 (e.g., antenna 130 of FIG. 1).

A second part of the input signal initially passes through λ/4 box 321. For this second part, the net effect of λ/4 box 321 is to act as an open circuit:

This means essentially all of the second part of the input signal also goes to port 110 for transmission by the antenna to which 110 is attached.

As will be familiar to those of ordinary skill in the relevant art, the open circuit effect of λ/4 box 321 results from two conditions: the λ/2 length of the round-trip (from node 313 to the ground of FET 301 and back to node 313), combined with reflection from the ground of FET 301.

The net result of λ/4 box 321, in Transmit Mode for switch 300 (meaning FET 301 is ON and 302 is OFF) is to cause port 111 to be (within a certain frequency range) isolated from both port 110 and 112. Isolation of port 111, when an input signal transfers from port 112 to port 110, has just been covered. The other types of transfers (between port 111 and each of ports 110 and 112) are covered by similar reasoning:

Signal entering at port 110 and exiting at port 112: a first part of the input signal travels directly through λ/4 box 322 and out port 112; a second part of the input signal (at node 313) "sees" λ/4 box 321 as an open circuit such that essentially all the second part also travels through λ/4 box 322 and out port 112.

For signal entering at port 111, it is isolated from each of ports 110 and 112 by the same mechanism: FET 301, being in an ON state, shunts all such input signal to ground.

To use RF switch 300 in Receive Mode, such that a signal input at port 110 exits through port 111, shunt transistor 301 is turned OFF (by application of an "off" signal at its gate terminal 311), and shunt transistor 302 is turned on (by application of an "on" signal at its gate terminal 312).

Because switch 300 is a symmetric design, isolation of port 112, from each of ports 110 and 111, operates in the same ways as discussed just above for Transmit Mode, except:

a reference to a component on the left side of switch 300 is replaced by reference to a component on the right side of switch 300, a reference to a component on the right side of switch 300 is replaced by reference to a component on the left side of switch 300, and references to the middle-of-switch components (i.e., port 110 and node 313) stay the same.

For an example of FIG. 3, in the prior art, one can refer to the following reference: Ayasli et al., "An X-Band 10 W Monolithic Transmit Receive GaAs Fet Switch," 1982; especially FIGS. 1a and 4 of Ayasli.

The use of a path of length λ/4 with a shunt transistor has the disadvantage of reducing the usable bandwidth. This is because a path length of λ/4 is relative to the frequencies input to it. The input frequency must make the path length λ/4, or sufficiently close to λ/4.

However, for the intended signal path, use of a λ/4 box has the advantage of not increasing insertion loss, since there is only wire between the intended input and output port, and no pass-through transistor through which the signal must flow.

FIG. 4 depicts an RF switch 400 that is the same as RF switch 300 of FIG. 3, except additional shunt transistors (401 and 402) and inductors (421 and 422) have been added.

Under one scenario, the channel width of FET's 401 and 301 of FIG. 4 can equal the channel width of just FET 301 of FIG. 3, and the channel width of FET's 402 and 302 of FIG. 4 can equal the channel width of just FET 302 of FIG. 3. In this case, the circuit of FIG. 4 can handle higher frequencies, than FIG. 3, because the capacitance added to each port of FIG. 4 is distributed along a transmission line (discussed further below).

Under a second scenario, the channel width of FET's 401 and 301 of FIG. 4 can be greater than the channel width of just FET 301 of FIG. 3, and the channel width of FET's 402 and 302 of FIG. 4 can be greater than the channel width of just FET 302 of FIG. 3. Under this second scenario, the additional shunting capacity (of greater channel width) can increase isolation of the unused port (either 111 or 112), by establishing a lower resistance connection to ground.

Also, it is typically the case that a high-frequency (e.g., microwave or millimeter wave) RF switch is used within an environment where wires act as transmission lines, and a uniform impedance is maintained.

For purposes of example, FIG. 4 assumes the RF switch is used with 50 ohm transmission lines. Under scenario two, the additional channel width does not just establish a better connection to ground, but also adds capacitance to the port to which it is connected. For example, the greater net channel width of FET's 401 and 301 adds capacitance to port 111. Once the capacitance is increased, to maintain the same level of impedance (e.g., maintain 50 ohms), the level of inductance must be increased. In the case of port 111, inductor 421 compensates for the greater capacitance.

Even under scenario one, maintenance of a 50 ohm transmission line requires determining an appropriate inductance between the FET's connected to a port (e.g., inductor 421 is sized for FET's 401 and 301).

For an example of FIG. 4, in the prior art, one can refer to the following reference: Devlin, "The Design of Integrated Switches and Phase Shifters," 1999, and especially FIG. 11 of Devlin.

Also shown in FIG. 4, is a typical form of the impedance formula:

$$\sqrt{\frac{L}{C}}$$

FIG. 5 depicts an RF switch 500 that is a combination of the pass-through approach of FIG. 1 with the shunting of FIG. 3.

An advantage of combining a pass-through FET (e.g., 102) with a shunting FET (e.g., 302) is that a total path length (e.g., from node 313 through FET 302 to ground, and then the reverse path back to node 313) does not need to be maintained at λ/2. This allows RF switch 500 to have greater bandwidth than RF switch 300.

For example, assume RF switch 500 is in receive mode (or Receive Mode), where a signal is input at port 110, and exits the switch through port 111. In that case, transmit Port 112 is isolated (from port 110 and 111) by pass-through FET 102 being off (i.e., an off signal is applied to gate 122). Any signal still passing through 102 is shunted to ground by FET 302 being "on" (i.e., an on signal is applied to gate 312).

While handling greater bandwidth than RF switch 300, RF switch 500 still achieves low insertion loss by use of only a single pass-through FET for either Receive or Transmit Mode.

For an examples of FIG. 5, in the prior art, one can refer to either of the following references:

Sanusi et al., "15 GHZ SPDT Switch Design using 0.15 μm GaAs Technology for Microwave," 2008; especially FIG. 2 of Sanusi.

Devlin, "The Design of Integrated Switches and Phase Shifters," 1999; especially FIG. 7 of Devlin.

FIG. 6 and its RF switch 600 is the same as FIG. 5, except each gate is driven through a resistor. Specifically, transistors 101, 102, 301, and 302 have their gates, respectively 121, 122, 311, and 312, driven through, respectively, resistors 601, 602, 611, and 612.

The resistors address the following problem. The gates of RF switch 600 are connected in pairs. Specifically, the gates of FET's 101 and 302 are supposed to receive the same first control signal through conductor 622, while the gates of FET's 102 and 301 are supposed to receive the same second control signal through conductor 621. Further, the control signal of conductor 622 is supposed to be opposite the control signal of conductor 621.

As can be seen, for purposes of example, the FET pair represented by conductor 622 receives an OFF signal, while the FET pair represented by conductor 621 receives an ON signal. This assignment of control signals puts RF switch 600 into Transmit Mode, where the signal input at port 112 exits the RF switch at common port 110. Without the resistors, any unintended signal generated (because of parasitics) at one gate of a FET pair is directly applied to the gate of the pair's other FET. With the resistors, however, any unintended signal is greatly attenuated before reaching the gate of the pair's other FET. The result is often reduced insertion loss, greater isolation, or both. The cost for such improvements, however, is a slowing of the switching speed of the FET's, because intended control signals are attenuated as well.

For an example of FIG. 6, in the prior art, one can refer to the following reference: Bedard et al., "A HIGH PERFORMANCE MONOLITHIC GaAs SPDT SWITCH," 1985, 15th European Microwave Conference; especially FIG. 1 of Bedard.

Asymmetrical RF switches are also known in the prior art. An asymmetrical design can take advantage of an asymmetrical environment in which the RF switch is to be used.

For example, FIG. 7 depicts an RF switch 700, that is the same as RF switches 500 and 600, except an additional pass transistor 701 (with gate terminal 721) has been added.

As with FIG. 6, switch 700 of FIG. 7 is also shown in Transmit Mode, where a signal input at port 112 will exit RF switch 700 at common Port 110. Regarding insertion loss and isolation, it will be assumed that RF switch 700 needs lower insertion loss and better isolation in Transmit Mode than in Receive Mode.

This asymmetry can be appreciated as follows.

First, let us consider insertion loss. In Transmit Mode, the signal input at port 112 only needs to pass-through FET 102, whereas, in Receive Mode, the signal input at port 110 must pass-through FET's 101 and 701. With regard to shunting, its effect on insertion loss is the same for Transmit and Receive, since both Modes use one FET. Therefore, Transmit Mode has lower insertion loss than Receive Mode.

Secondly, isolation is considered. In Transmit Mode, port 111 is isolated, from ports 110 and 112, by FET's 101 and 701 both being off, whereas, in Receive Mode, port 112 is isolated from ports 110 and 111 by single pass-through FET 102 being off. With regard to shunting, the effect on isolation is the same, since both Transmit and Receive Modes use one FET. Therefore, Transmit Mode has both greater isolation and lower insertion loss than Receive Mode.

For an example of FIG. 7, in the prior art, one can refer to the following reference: Chen et al., "High-Power Switch Using LC_Resonator and Asymmetric MOS Transistor for 5G Applications," 2021; especially FIG. 1 of Chen.

FIG. 8A depicts an asymmetric RF switch 800, that uses a λ/4 box (e.g., the 322 from FIG. 3) for Receive Mode, while Transmit Mode is handled with a pass-through transistor (e.g., 101 of FIG. 1). In Receive Mode, a signal received at an antenna (e.g., 130 of FIG. 1) enters switch 800 at the Common Port (810) and exits at Receive port 812. In Transmit Mode, a signal input at Transmit Port 811 exits switch 800 at the Common Port.

FIG. 8A is said to be optimized for Receive Mode, because the low insertion loss path (between ports 810 and 812) is allocated to reception.

As can be appreciated, in Receive Mode, shunt transistor 302 and pass-through transistor 101 are both OFF (and this is shown in the figure). This leads to the following:

With no connection to ground, λ/4 box 322 just acts as essentially a wire (or transmission line), connecting ports 810 and 812, so insertion loss is kept to a minimum.

Isolation of Tx Port 811 is accomplished by pass-through FET (101) being OFF.

Transmit Mode can be accomplished by flipping the state to ON for each of shunt transistor 302 and pass-through transistor 101:

Insertion loss: the signal input at port 811 must pass-through the ON pass transistor 101 prior to exiting at port 810. Insertion loss is higher than Receive Mode, because the path from 811 to 810 is not just a transmission line.

Isolation of Rx Port 812 is accomplished with Shunting FET 302 in an ON state. For a signal traveling from 812, towards 810 or 811, it is reflected back to 812 by the ground connection of FET 302. For a signal traveling towards 812, from 810 or 811, λ/4 box 322 presents what looks like an open circuit (e.g., a voltage can be established at node 313, but no power is dissipated in the right side of the switch, which includes λ/4 box 322 and transistor 302).

For an example of FIG. 8A, in the prior art, one can refer to the following reference: Lee et al., "A 25-30 GHz Asymmetric SPDT Switch for 5G Applications in 65-nm Triple-Well CMOS," 2019; especially FIG. 1 of Lee.

BRIEF DESCRIPTION OF THE DRAWINGS

The accompanying drawings, that are incorporated in and constitute a part of this specification, illustrate several embodiments of the invention and, together with the description, serve to explain the principles of the invention:

FIG. 3 depicts another approach to achieving an RF switch 300 with similar basic functionality to switch 100.

FIG. 7 depicts an RF switch 700, that is the same as RF switch 500, except an additional pass transistor 701 (with gate terminal 721) has been added.

FIG. 8A depicts an asymmetric RF switch 800, that uses a λ/4 box (e.g., the 322 from FIG. 3) for Receive Mode, while Transmit Mode is handled with a pass-through transistor (e.g., 101 of FIG. 1).

FIG. 10C presents a more generic view of the first asymmetric architecture (indicated as asymmetric RF switch 1001).

FIG. 13 presents a loss Table 1300, with performance numbers from a simulation of asymmetric switch 1100, and the results compared with a state-of-the-art symmetric RF switch.

DETAILED DESCRIPTION

Reference will now be made in detail to various embodiments of the invention, examples of which are illustrated in the accompanying drawings. Wherever possible, the same reference numbers will be used throughout the drawings to refer to the same or like parts.

TABLE OF CONTENTS TO DETAILED DESCRIPTION

1 Introduction
2 Stacking
3 Asymmetries in an RF Switch Design
   3.1 A First Asymmetric Architecture
      3.1.1 FET's In Series
      3.1.2 Channel Width or FET's In Parallel
   3.2 A Second Asymmetric Architecture
   3.3 Optimized for Receive
      3.3.1 Receive Mode
      3.3.2 Transmit Mode
   3.4 Example Performance
4 EDA Software
5 Glossary of Selected Terms
6 Summary

1 INTRODUCTION

Switch 800 of FIG. 8A can be described as optimized for Receive Mode and, based on the OFF state of its control transistors (i.e., 101 and 302), is shown in Receive Mode. For purposes of discussion, receiving is described herein as having a signal input at the Common Port (e.g., 810) and exiting the switch (e.g., 800) at the Receive Port (e.g., 812). Transmit mode is described herein as a signal being input at the Transmit Port (e.g., 811) and exiting the switch (e.g., 800) at the Common Port (e.g., 810). However, it will be appreciated that once a switch is in a Mode, signals can travel in either direction between the pair of connected ports.

In FIG. 8A, the OFF state of FET 101 causes the Transmit Port (e.g., 811) to be isolated from either of the ports involved with Receive Mode (e.g., isolated from 810 and 812). The OFF state of FET 302 permits signals to flow between the Common and Receive Ports (e.g., between 810 and 812), because the Receive Port is no longer shunted to ground. As discussed above, switch 800 can be described as optimized for Receive Mode because its lowest insertion loss path (e.g., the path between 810 and 812, when it is just acting as a "wire" (or transmission line) is allocated to Receive Mode.

Figure 8B:
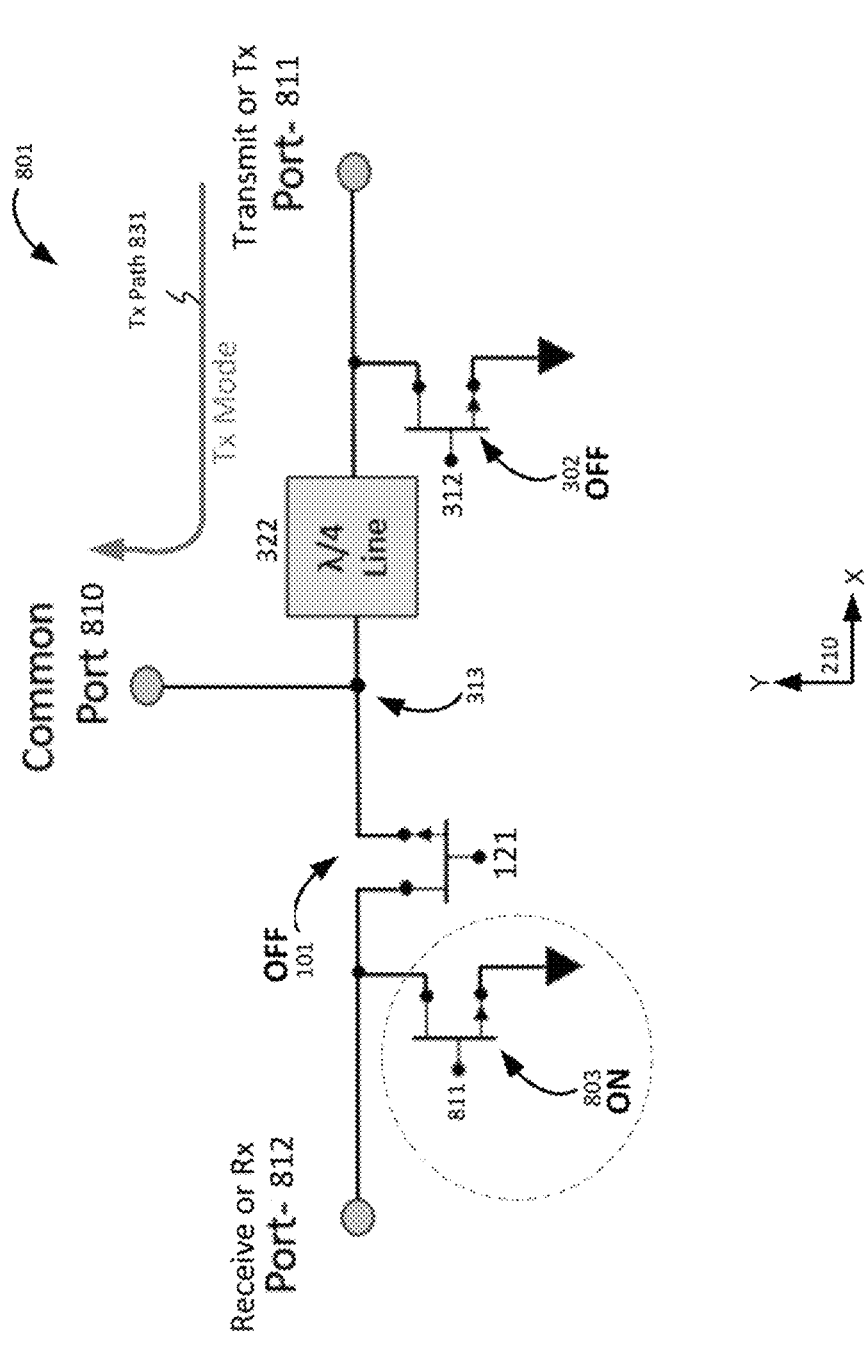
FIG. 8B depicts a modification of the use environment of FIG. 8A, where Ports 811 and 812 are reversed, resulting in a design (switch 801) that can be described as optimized for Transmit Mode.

FIG. 8B depicts a modification of the use environment of FIG. 8A, where Ports 811 and 812 are reversed, resulting in a design (switch 801) that can be described as optimized for Transmit Mode. This is because the lowest insertion loss path (i.e., the path between 810 and 812 in FIG. 8A) is now allocated to Transmit Mode (i.e., the path between ports 811 and 810). Transmit Mode of switch 801 is achieved by control transistors 101 and 302 being in the same state discussed above for Receive Mode of switch 800: transistors 101 and 302 are OFF (as they are shown in FIG. 8B).

It can be appreciated that the signal for the lowest insertion loss path can flow through the same hardware, regardless of whether it is used for a transmit or receive function. However, the direction of the signal is reversed. An example can be seen by comparing Rx Path 830 (of FIG. 8A) to Tx Path 831 (of FIG. 8B).

FIG. 8B depicts an important additional invention when compared with FIG. 8A. When the lowest insertion loss path is active, such as Tx path 831 of FIG. 8B, extra isolation from the currently unused port (e.g., port 812) is achieved by the introduction of a shunt coupled to the unused port. For FIG. 8B, the shunt coupled to the unused port is comprised of a transistor 803, driven to an ON state with appropriate signal applied to its gate 811. In general, the addition of a shunt, and not solely relying on the OFF state of a pass transistor (e.g., FET 101 of FIG. 8B), increases isolation of the unused port by at least two orders of magnitude. It should be noted that the application of the inventive shunt, to the unused port, can also be applied to a switch optimized for Receive Mode (e.g., switch 800 of FIG. 8A).

The asymmetric switch design of FIGS. 8A-8B can be very useful, since it permits adaptation to an operating environment where the lowest insertion loss path is necessary for one of transmit or receive. However, it has significant limitations on adaptability for a wide range of important performance factors, including the following (considering FIG. 8A):

The level of isolation that can be provided, by an OFF pass-through FET (e.g., 101 isolating Port 811) or ON shunt FET (e.g., if 302 is ON and isolating Port 812).

Power handling, two types:

Limited by the standoff voltage a shunting FET can withstand (e.g., 302) when OFF. For a given transmission line impedance ($r_{TL}$), greater power handling means a greater RMS voltage ($v_{rms}$). This, in turn, implies a shunting FET (e.g., 302), in OFF mode, able to withstand the corresponding peak voltage ($v_p$), which is significantly higher than $v_{rms}$ ($v_p = v_{rms}/0.707$). The same reasoning applies to the limited standoff voltage a pass-through FET can withstand (e.g., 101) when OFF.

limited by the current handling capacity, when ON, of both a pass-through FET (e.g., 101) and shunting FET (e.g., 302).

Frequency range or bandwidth. Bandwidth is limited by the choice of A for the λ/4 box (e.g., 322). Bandwidth can be further limited by parasitic FET capacitances (i.e., source to drain, gate to source, gate to drain, or any combination.)

In comparison to FIGS. 8A-8B, advantages of the present invention include the following:

A highly flexible design, for an asymmetric RF switch, that can be systematically adapted to a wide range of performance factors, process nodes, or both.

The introduction of a second shunting structure, that enhances, by at least two orders of magnitude, the isolation provided by just a pass through.

While the present invention can be used in the microwave frequencies, it was developed for use in the millimeter wave frequencies, such as 10-40 GHz. Within a range such as this, a λ/4 box could be tuned to work at a particular frequency (e.g., 30 GHZ), plus or minus a certain amount (e.g., plus or minus 4 GHz). As will be familiar to those of ordinary skill in the relevant art, a λ/4 box (e.g., 322) does not represent a particular component at its location. Rather, it represents the length of the one-way path between the following nodes:

The node (which can be referred to herein as the central node node), such as node 313 of FIG. 8A, where the Common port, the left side of the switch, and the right side of the switch are connected.

The node at which the shunt, which must be ON for utilizing the λ/4 path length, couples to a power rail (in the case of nFET's ground). In the case of FIG. 8A, it is the connection of shunt transistor 302 to ground.

The λ/4 box also makes it easier to visualize the fact that, when its shunt is engaged, it causes its side of the switch (right side in FIG. 8A) to appear as an open circuit.

While the present invention can be used wherever asymmetric RF switching is needed, it was developed to permit an antenna to act as both a source of transmission, and a receiver of transmissions from other sources (e.g., other antennas). Such dual use can require a different set of performance specifications for each of Transmit Mode and Receive Mode. For example, use of an antenna as a transmitter often requires higher power signals than those expected to be received by the same antenna. Because of this, it can be crucial to reduce insertion loss for Transmit Mode, even if Receive Mode's insertion loss becomes somewhat higher.

Compared to a symmetric RF switch, it can be the case (for example) that insertion loss for Transmit Mode of an asymmetric RF switch is lower than that of a comparable symmetric RF switch, while the Receive Mode of the asymmetric RF switch has higher insertion loss than the symmetric design. Sacrificing higher insertion loss for Receive Mode for lower insertion loss for Transmit Mode may be desirable. For example, because reducing transmission loss, with its high power signals, may have greater impact on reducing overall power dissipation, even with an increased power dissipation in Receive Mode.

2 STACKING

Figures 9A, 9B:
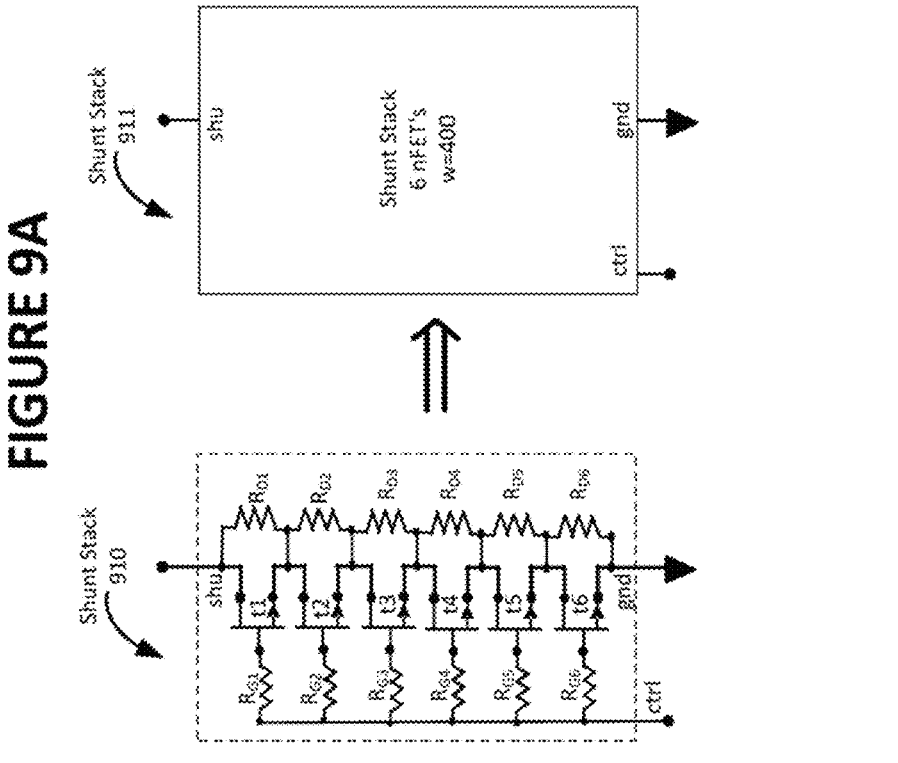
FIGS. 9A-9B depict an architecture by which a stack (shunt or pass-through) can be expanded to comprise essentially any number of series-connected FET's.

Rather than using a single shunt transistor, such as FET 302 of FIGS. 8A-8B, FIG. 9A depicts an architecture by which a shunt can be expanded to comprise essentially any number of series-connected FET's. We shall refer to two or more FET's coupled in series as a "stack." A stack that couples a node to a power rail (e.g., Gnd) can be called a "shunt stack." The example Shunt Stack 910, shown in FIG. 9A, depicts six FET's in series labeled: t1-t6. A stack that couples two non-power-rail nodes together can be called a "pass-through" or PT stack. The example PT Stack 920, shown in FIG. 9B, depicts 8 FET's in series labeled: t1-t8.

The pair of nodes a stack connects in its "ON" state, or maintains isolation between in its "OFF" state, can be referred to as the "connection nodes" of the stack. The node by which a stack can be switched between its ON and OFF states can be called the control node. For Shunt Stack 910, its connection nodes are labeled "gnd" and "shu" (for shunt), while for PT Stack 920 its connection nodes are labeled p1 and p2. For both the shunt and PT stacks, its control node is labeled "ctrl." As can be appreciated, from the wiring diagrams for 910 and 920, an ON state means all FET's of a stack's series are in an ON state. Conversely, an OFF state means all FET's of a stack's series are in an OFF state.

For purposes of example, component or signal values herein can be considered as resulting from a Silicon-On-Insulator (or SOI) process, as applied to the construction of stacks from nFET's. With the necessary changes, the designs presented herein be adapted for pFET's.

Control signals for a control node can be considered as +2.5 v for putting a stack in an ON state, while –2.5 v can put the same stack in an OFF state. An ON state for a stack means each FET of its series is in a conductive state, where signals can flow between source and drain. Conversely, an OFF state for a stack means each FET of its series is in a non-conductive high resistance state.

For purposes of higher level design, Shunt Stack 910 is abstracted to just have its connection nodes and control node as Shunt Stack 911. PT Stack 920 is also abstracted to just have its connection nodes and control node as PT Stack 921. As can be seen, shunt stack 911 is labeled as having 6 nFET's in series, with a channel width for each nFET being w=400 (or 400 microns or μm). Shunt stack 921 is labeled as having 8 nFET's in series, with a channel width for each nFET being w=400.

The present invention is based in part on a realization that stacks (rather than a single transistor) are becoming more important, as feature sizes for FET's continue to decrease, but the real world environment to which the FET's must interface (e.g., achieving a level of transmit power) has often not. Decreasing feature size (also called smaller process "nodes") permits such advantages as higher frequency operation, and more functionality per integrated circuit (or "chip"). The stack architectures of the present invention are designed to obtain the advantages of smaller process nodes, while keeping interfacing with real-world signals.

A shunt or PT stack can include gate resistors. Some of the RF power through a stack is coupled to the gates because of parasitic capacitances between the gate and source or gate and drain. Such coupling causes back currents through the gates.

Gate resistors promote independent operation of each stack transistor, by preventing such back currents from affecting the gates of other FET's that are part of the same FET series of which the stack is formed. The primary downside of gate resistors is lower switching speed of the state of a stack, between ON and OFF. Optimal resistance for the gate resistors can be found by any search or optimization algorithm that can balance between the following:

Sufficiently high gate resistance such that each FET's gate is isolated from back currents of the other FET's of a stack.

Sufficiently low gate resistance to enable the necessary (or specified) speed of switching of stack states.

For Shunt Stack 910, it can be seen to include gate resistors labeled: $R_{G1}$-$R_{G6}$. PT Stack 920 can also be seen to include gate resistors labeled: $R_{G1}$-$R_{G8}$. An example range for a gate resistor is:

$$20 \ K\Omega \le R_G \le 100 \ K\Omega$$

For purposes of discussion, we will assume 20 KΩ gate resistors are used here.

Additionally (or alternatively) to gate resistors, a stack (e.g., Shunt Stack 910 or PT Stack 920) can include voltage dividing resistors (e.g., $R_{D1}$-$R_{D6}$. for Shunt Stack 910 and $R_{D1}$-$R_{D8}$ for PT Stack 920). These resistors are particularly important when a stack is in the "OFF" state (meaning all transistors of its series are driven to the "OFF" state). To maintain isolation between its connection nodes (under all expected operating conditions), the stack is designed to handle the highest (or peak) voltage (i.e., $v_p$) that may occur. The $v_p$ of a stack is the sum of the peak standoff voltage of each of the individual FET's of its series. $v_p$ is implemented most efficiently when dividing resistors ensure $v_p$ is evenly distributed across all FET's of its series.

Optimal resistance of voltage-dividing (or source-to-drain) resistors can be found by any search or optimization algorithm that can balance between the following:

Sufficiently high to permit an OFF state of a stack to provide sufficient isolation between its connection nodes.

Sufficiently low to promote even divisibility of peak RF voltage across a stack of FET's that are all in the OFF state.

An example range for a voltage-dividing resistor is:

$$20 \ K\Omega \le R_D \le 100 \ K\Omega$$

For purposes of discussion, we will assume 50 KΩ voltage-dividing resistors are used here.

Therefore, if a ctrl signal is keeping the FET's of stack 910 at OFF, the shunt-to-gnd resistance (or $R_{shu\text{-}gnd\text{-}OFF}$) will be ≈6×50 KΩ or 300 KΩ. If a ctrl signal is keeping the FET's of stack 920 at OFF, the p1-to-p2 resistance (or $R_{p1\text{-}p2\text{-}OFF}$) will be ≈8×50 KΩ or 400 KΩ.

12

If the ctrl signal of stack 910 or 920 is keeping its FET series in an ON state, the resistance between its connection nodes is approximated at ≈1Ω.

3 ASYMMETRIES IN AN RF SWITCH DESIGN

Figures 1A, 1B:
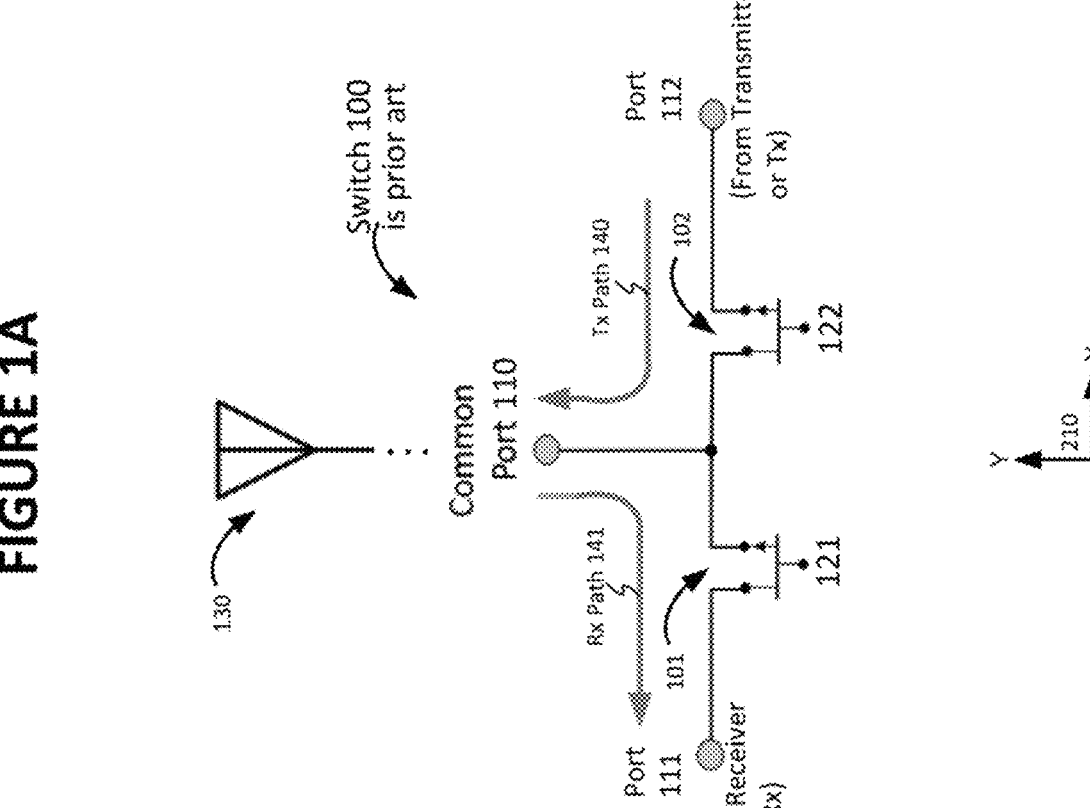
FIG. 1A depicts a particularly simple RF switch, composed of two N-channel Field Effect Transistors (FET's).
FIG. 1B depicts the same RF switch 100 as FIG. 1A, except the environment for switch 100 is changed.
Figure 2:
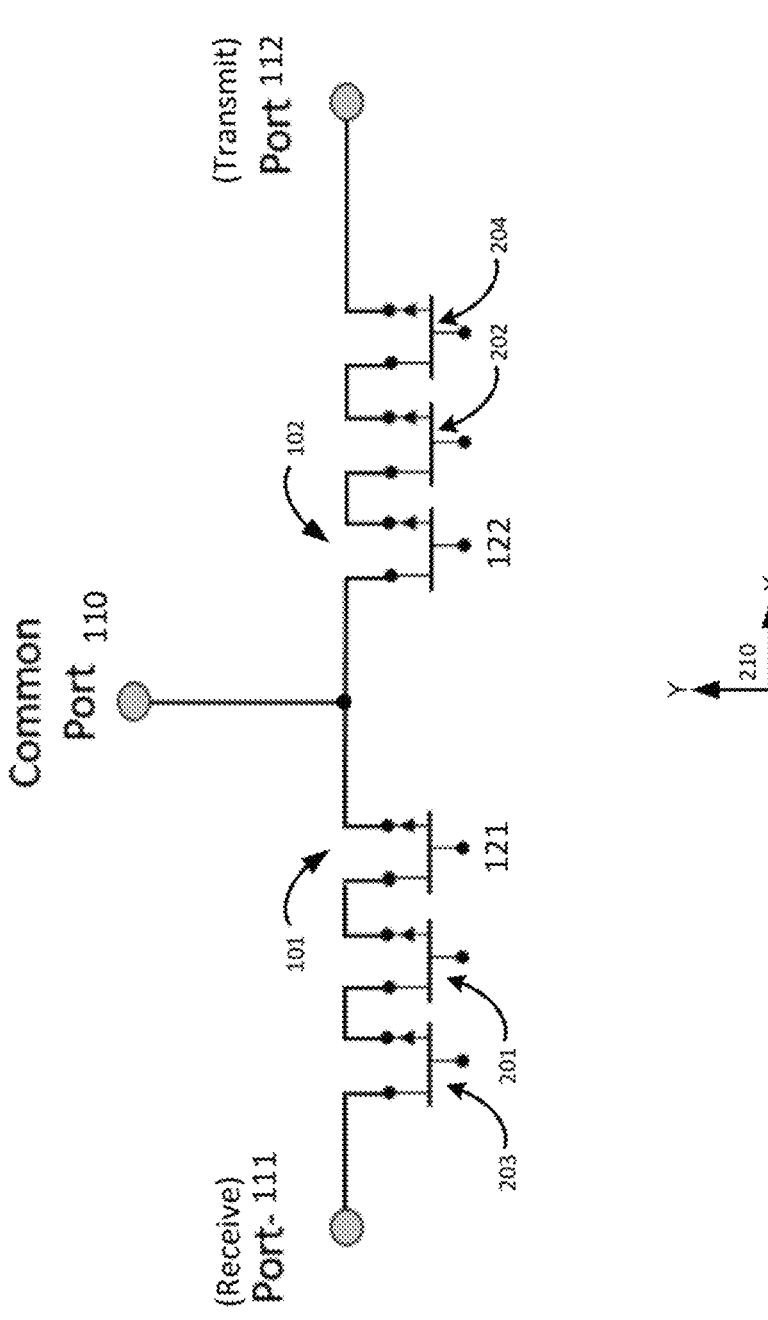
FIG. 2 depicts an example design for addressing the capacitance parasitics of the FET. Capacitors in series have a net capacitance less than each series member.
Figure 4:
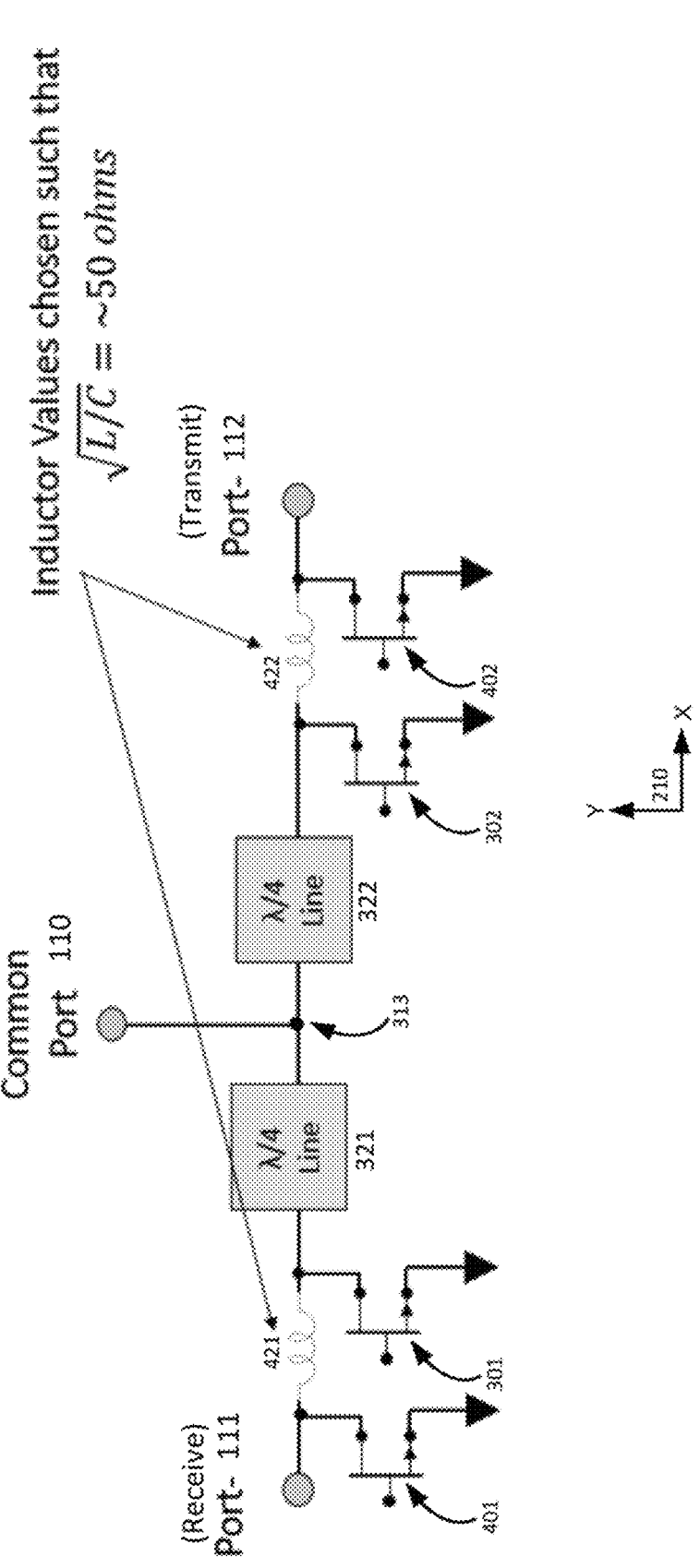
FIG. 4 depicts an RF switch 400 that is the same as RF switch 300 of FIG. 3, except additional shunt transistors (401 and 402) and inductors (421 and 422) have been added.
Figure 5:
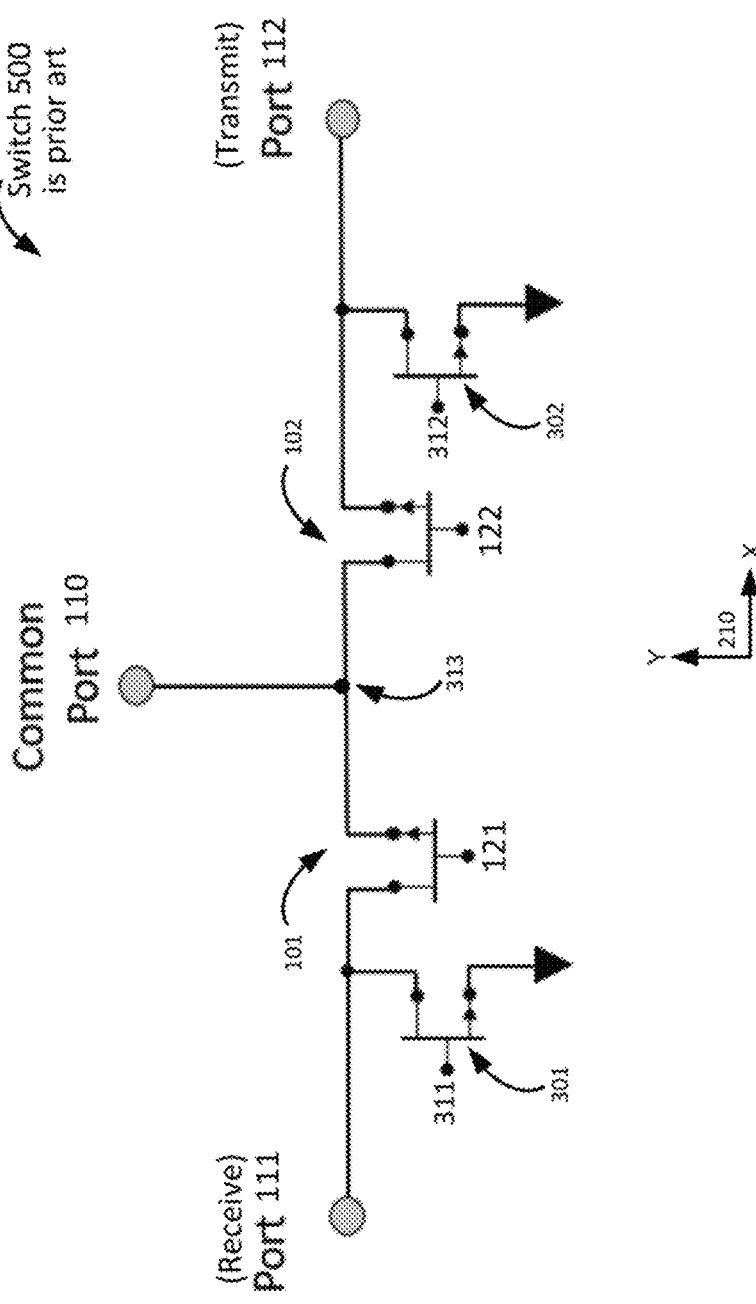
FIG. 5 depicts an RF switch 500 that is a combination of the pass-through approach of switch 100 with the shunting of switch 300.
Figure 6:
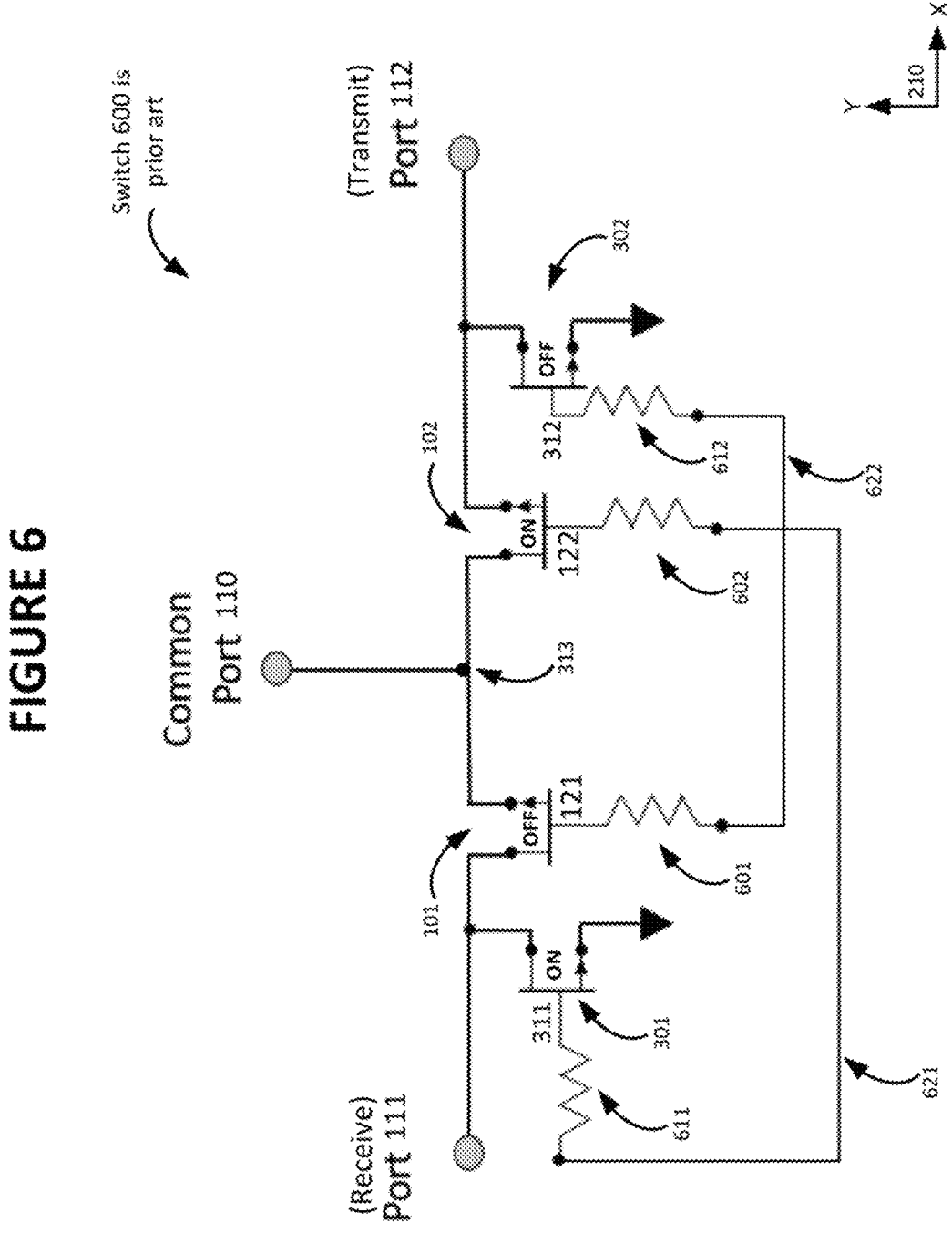
FIG. 6 depicts an RF switch 600 the same as switch 500, except each gate is driven through a resistor.

In this section, asymmetric architectures are presented for a Single Pole Double Throw (SPDT) switch constructed in accordance with the techniques of the present invention. As discussed above, for example with respect to FIG. 1, a Common (or C) port can be selectively connected to either a port 111 or a port 112. Ports like 111 and 112 can be referred to more generally as selectable ports.

In general, when an RF switch is in Receive Mode, signal can flow (in either direction) between its Common port (e.g., port 110, of switch 100) and Receive (or Rx) port (e.g., Receive Port 111). For the example switches presented herein, the main purpose of Receive Mode is routing a signal from a Common port (acting as an input to the RF switch) to an Rx port (acting as output from the RF switch). This routing can be called a Receive Path. With respect to an active Receive Path, the Transmit Port is unused. The goal for the Transmit Port and Receive Path is to keep them as electrically isolated as possible from each other, meaning as little signal flow as possible (in either direction).

Conversely, when an RF switch is in Transmit Mode, signal can flow (in either direction) between its Transmit (or Tx) port (e.g., Transmit Port 112), and Common port (e.g., C port 110). For the example switches presented herein, the main purpose of Transmit Mode is routing a signal from a Transmit Port (acting as an input to the RF switch) to a Common Port (acting as an output from the RF switch). This routing can be called a Transmit Path. With respect to an active Transmit Path, the Receive Port is unused. The goal for the Receive Port and Transmit Path is to keep them as electrically isolated as possible from each other, meaning as little signal flow is possible (in either direction).

The usefulness of asymmetries, in an RF switch design, can result from at least two sources:

1. The signals themselves can differ. In the example of a dual use antenna (e.g., 130), it is usually the case that received signals are of much lower power than signals for transmission. The power difference can be easily three orders of magnitude, or more. For purposes of example, we will assume a transmission signal of 5 W, and a received signal of 1 mW.

2. The priority of the received and transmitted signals can differ. When focusing on the suitability of a particular switch design, the following two factors are often of great importance:

a. Insertion Loss: This is measured between two nodes (or two ports) that are intended to be connected. For the present SPDT switch, and referencing FIG. 1 as an example, the two nodes are either the Common node (e.g., node 110) and a first selectable node (e.g., node 111), or the Common node and a second selectable node (e.g., node 112). For a pair of nodes, its insertion loss is the amount of signal lost, between the signal entering the switch, at a first node of the node pair, and exiting the switch (at a second node of the node pair).

b. Isolation: For the present SPDT switch, when a pair of nodes is connected to form a Receive Path or Transmit Path, the goal is to keep the unused selectable node as electrically isolated as possible from the Path. Is supposed to have no coupling with either node of the connected node pair. For example, in FIG. 1, let's consider the case when signals are input to Transmit Port 112, and exit at Common Port 110 (because of an ON state for FET 102), forming a Transmit Path. There should ideally be no coupling between the Transmit Path and receive port 111 (for this example, accomplished by FET 101 being in an OFF state).

In addition to the two sources discussed just-above, a third important source of asymmetries is a specification (typically written by a human circuit or project designer) of the environment in which a switch is to operate. When a specification is available, rather than use a more generic (e.g., symmetric) switch, the switch can be optimized for meeting the specification. For example, the differences between two different signal types (e.g., received signals or transmit signals) can be the result of a design specification. Similarly, the prioritization of a first signal type over a second, for minimized insertion loss, maximized isolation, or both, can also be part of a design specification.

In the following subsections, first and second asymmetric architectures are presented, each in accordance with the techniques of the present invention.

For each architecture, two combinations of performance metrics are presented, referred to as:

1. Optimized for Transmission
   a. Trade lower insertion loss in Transmission Mode (e.g., path from Tx to Common is active), in exchange for greater insertion loss when in Receive Mode (e.g., path from Common to Rx is active).
   b. Trade greater isolation of Rx in Transmission Mode (e.g., isolation between Rx and Transmit Path), in exchange for less isolation of Tx in Receive Mode (e.g., isolation between Tx and Read Path).
   c. Still maintain high power (e.g., 5 W) capability on Tx to Common; lower power capability is acceptable for Common to Rx.
2. Optimized for Receive
   a. Trade lower insertion loss in Receive Mode (e.g., path from Common to Rx is active), in exchange for greater insertion loss in Transmit Mode (e.g., path from Tx to Common is active).
   b. Trade greater isolation of Tx in Receive Mode (e.g., isolation between Tx and Receive Path), in exchange for less isolation of Rx in Transmit Mode (e.g., isolation between Rx and Transmit Path).
   c. Still maintain high power (e.g., 5 W) capability on Tx to Common; lower power capability is acceptable for Common to Rx.

3.1 A First Asymmetric Architecture

In this section, a first asymmetric architecture is presented, that is in accordance with the techniques of the present invention.

Figure 10A:
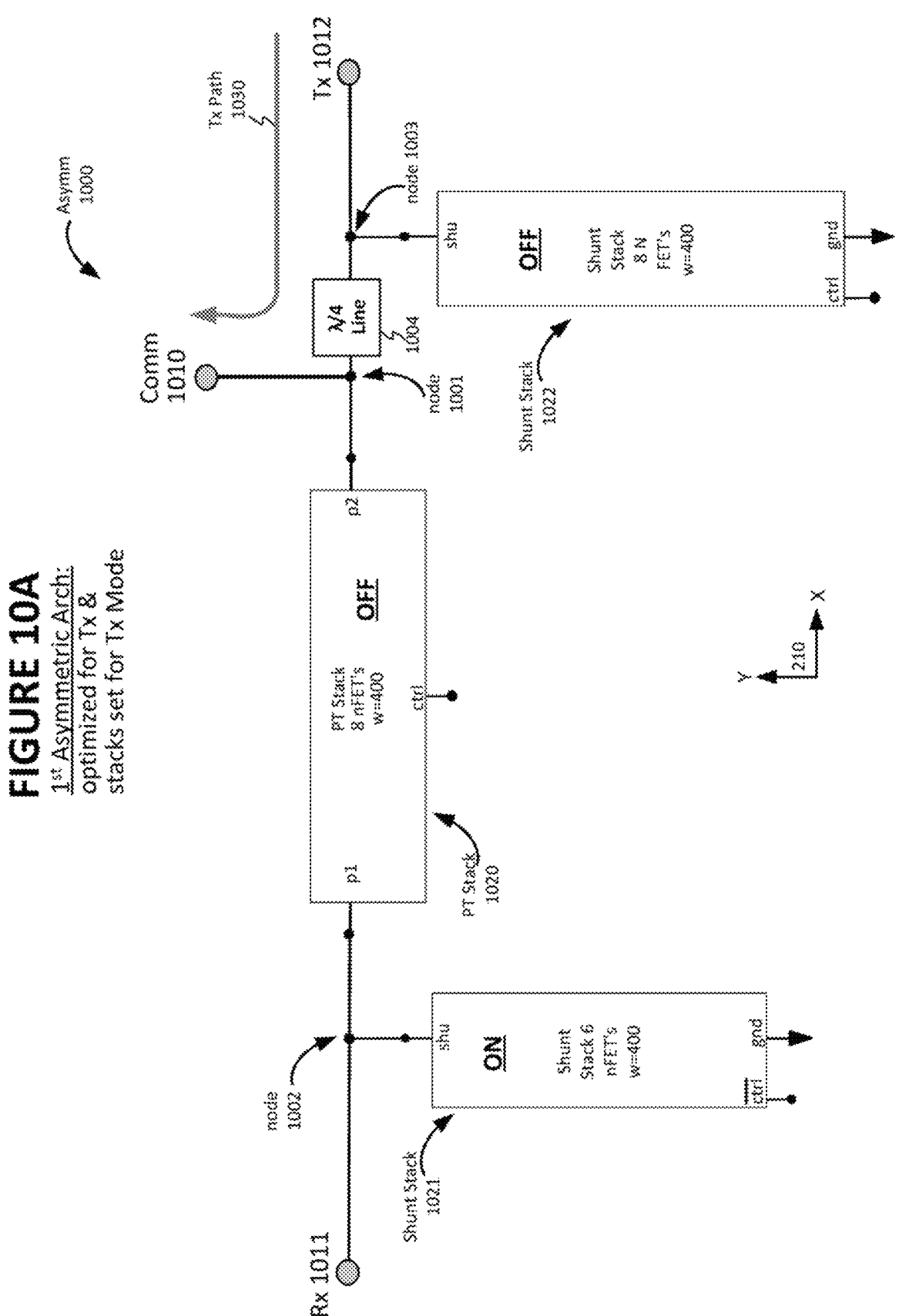
FIG. 10A presents a first asymmetric architecture optimized for transmission, and (because of the ON/OFF state of its stacks) in transmission mode.

FIG. 10A presents the first asymmetric architecture optimized for transmission, and (because of the ON/OFF state of its stacks) in transmission mode. FIG. 8B and FIG. 10A can be compared, respectively, as follows:

pass-through transistor 101 corresponds to pass-through stack 1020, and both are in the OFF state shunt transistor 302 corresponds to shunt stack 1022, and both are in the OFF state.

The first asymmetric architecture also includes a second shunt stack (e.g., shunt stack 1021 of FIG. 10A) that has no corresponding transistor in FIG. 8A. Unlike the other two stacks of FIG. 10A, shunt stack 1021 is shown in an ON state.

The operation of the first asymmetric architecture, as shown in FIG. 10A, can be described as follows.

The OFF state of shunt stack 1022 (along with the OFF state of PT stack 1020) causes an all-transmission-line path, for signals for transmission, input to switch 1000 at port Tx 1012 and exiting at port Common 1010. This path is labeled Tx Path 1030. The all transmission line nature of path 1030 causes it to have essentially the lowest insertion loss possible, which is why FIG. 10A is described as optimized for transmission. (Should a designer desire a Tx Path of opposite direction to that of Tx Path 1030, it would still be an all-transmission-line path.) For either direction, the OFF state of shunt stack 1022 leaves the λ/4 path length (between central node 1001 and the ground connection of shunt stack 1022) unused.

The OFF state of PT stack 1020 causes isolation between port Rx 1011 and Tx Path 1030.

The first asymmetric architecture also includes an inventive second shunt stack 1021, in an ON state as shown in FIG. 10A, that causes orders-of-magnitude greater isolation of Rx 1011, compared with what is possible with just a pass through stack (e.g., PT Stack 1020). RF signal at Tx 1012, that passes through PT stack 1020, is directed to ground by shunt stack 1021. An RF signal that happens to be input at Rx 1011 is first directed to ground by shunt stack 1021, and leakage past 1021 is further attenuated by PT Stack 1020.

Figure 10B:
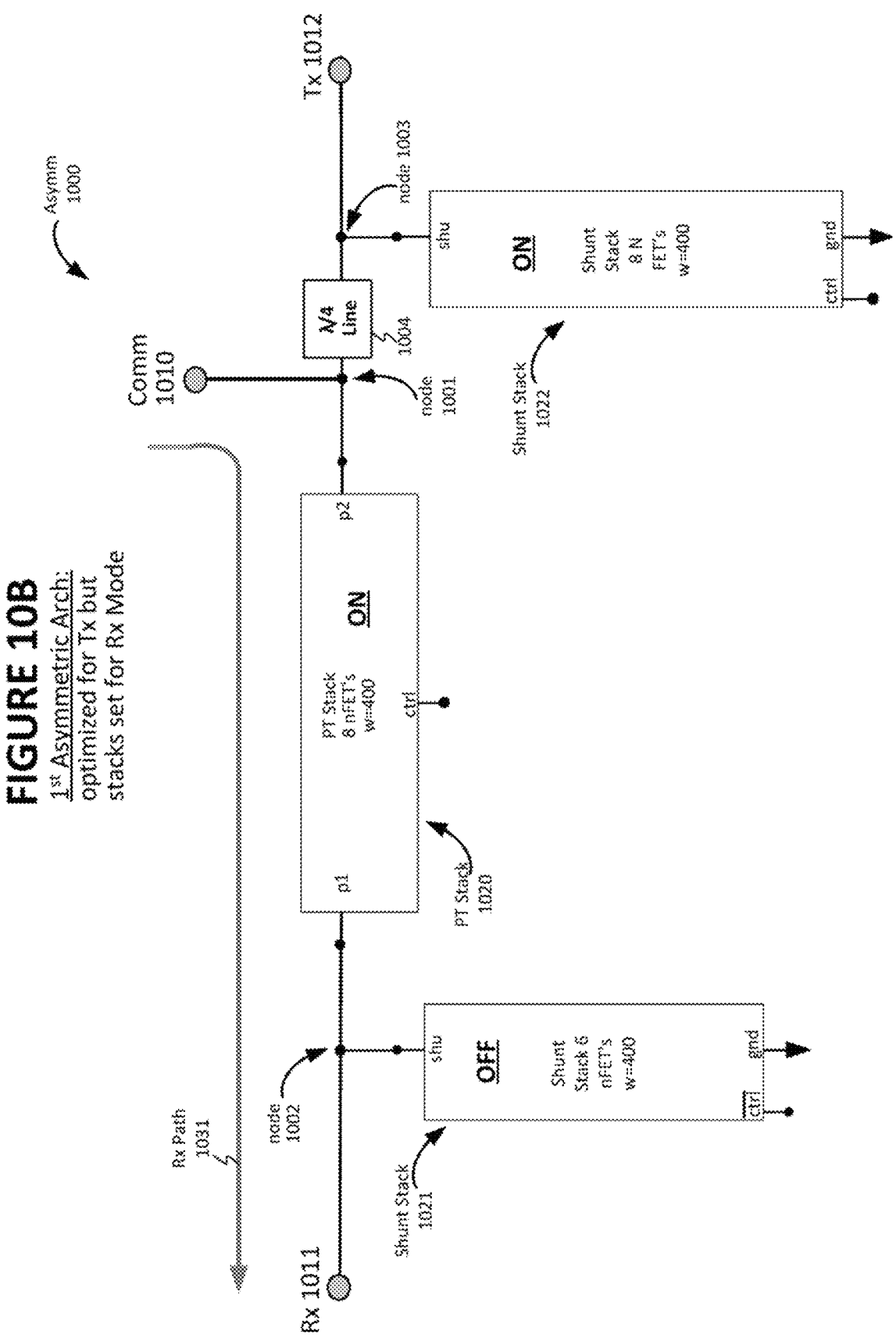
FIG. 10B presents the same first asymmetric architecture, as shown in FIG. 10A, but now the stack states are reversed.

FIG. 10B presents the same first asymmetric architecture, as shown in FIG. 10A, but now the stack states are reversed. The reversal of stack states puts switch 1000 in Receive Mode. As can be seen, whereas stacks 1020 and 1022 were OFF in FIG. 10A, they are ON in FIG. 10B. Similarly, while shunt stack 1021 was ON in FIG. 10A, it is OFF in FIG. 10B.

The operation of the first asymmetric architecture, in the state shown in FIG. 10B, can be described as follows.

The ON state of pass-through stack 1020, and the OFF state of shunt stack 1021, causes a path (i.e., Rx Path 1031) for received signals. The received signals are input to switch 1000 at port Common 1010 and exit at port Rx 1011. The fact that received signals transit across a pass-through stack causes Rx Path 1031 to have a higher insertion loss than Tx Path 1030. As discussed above, this type of tradeoff, of lower insertion loss for the Tx Path in exchange for higher insertion loss in the Rx Path, is an important example of the advantages of asymmetric design.

The ON state of shunt stack 1022, along with the λ/4 path length between its ground connection and central node 1001, causes the isolation between port Tx 1012 and Rx Path 1031. More specifically, for signal on Rx Path 1031, it first arrives at central node 1001 before affecting port Tx 1012. However, signal that attempts to flow rightwards, towards the λ/4 path 1004, "sees" the electrical equivalent of an open circuit. Other than this "open" circuit, signal of the Rx Path flows leftwards towards Rx port 1011 by the ON state of PT Stack 1020. This is shown as Rx path 1031 in FIG. 10B. The OFF state of shunt stack 1021 prevents the shunt from causing significant attenuation, and significant Rx signal can be expected to reach Rx port 1011. (Should a designer desire an Rx Path of opposite direction to that of Rx Path 1031, switch 1000 would permit the Rx Path, and isolate it from Tx port 1012, in essentially the same manner.) For signal originating at Tx port 1012, it is isolated from Rx Path 1031 by the shunting to ground of shunt stack 1022.

As can be appreciated, simply having shunt stack 1022 acting to isolate port Tx 1012, in Receive Mode, is not as effective as having both PT Stack 1020 and shunt stack 1021 isolate port Rx 1011, in transmit mode. This extra level of isolation is another reason (in addition to lower insertion loss) for referring to switch 1000's implementation of the first asymmetric architecture as optimized for transmission.

As can be appreciated, each stack of the first asymmetric architecture has a certain number of FET's in series, and a certain width for the FET's of each series. Considerations for each of these parameters (or design dimensions) is now presented.

3.1.1 FET's in Series

Choosing the number of FET's in series in a stack is driven primarily by the operating environment when the stack is in an OFF state. For shunt stack 1022 and PT stack 1020, their OFF state occurs as part of putting asymmetric switch 1000 in transmit mode (FIG. 10A). The voltage each stack must withstand can be determined from a power specification for the transmit signals and an impedance specification for the transmission lines. In this example, we will assume a specification calls for an ability to handle five watt transmission signals, and transmission line impedance of 50 ohms. We will use the following formula:

$$v_{rms} = \sqrt{w \times r}$$

Where:

w is power in watts (e.g., 5 w) and r is impedance in ohms (e.g., 50Ω)

$$v_{rms} = \sqrt{5 \times 50}$$
$$v_{rms} = \sqrt{250}$$
$$v_{rms} = 15.8v$$

To consider the necessary standoff voltage, one needs to know the peak voltage ($v_p$), where:

$$v_p = v_{rms} \times \sqrt{2} = 22.35v$$

With 8 series transistors for each of stacks 1022 and 1020, the amount of peak voltage to be withstood by each FET is as follows:

$$v_{p/FET} = \frac{v_p}{8 \ FET's} = 2.8_{v_p/FET}$$

Considering all of $v_p$ as occurring along a stack is a reasonable approximation since 8 FET's in an OFF state, connected in series, represents a much higher resistance than the 50 ohms of the transmission line to which each stack is connected. Per the example discussed with FIGS. 9A-9B, this could be 8×50KΩ=400KΩ. In contrast, the resistance of a stack in the ON state, such as 1021 of FIG. 10A, will be approximated (for example, to a nearest order of magnitude) as 1Ω.

For the example SOI process discussed herein, we will assume each FET has a standoff voltage in the following range: 3.0-3.5 v. Therefore, the choice of 8 FET's represents reasonable over design, especially when compared with 7 FET's, that would likely allocate too much $v_p$ (e.g., 3.2 v) to each FET. While a designer does need to ensure sufficient standoff capability when a stack is OFF, having a longer series than needed can have undesirable effects when the same stack is used in its ON state. While an ON state stack has vastly lower resistance than in OFF mode, it is still advantageous having such ON resistance as low as possible. The ON state of a stack is generally used for demanding purposes, such as bringing a node as close as possible to ground. Thus, while shunt stacks 1021 and 1022 are both used for grounding a node (respectively, nodes 1002 and 1003), it can be expected that shunt stack 1021 will provide a stronger ground than 1022. This difference can lead to significant changes in switch performance.

Figure 11A:
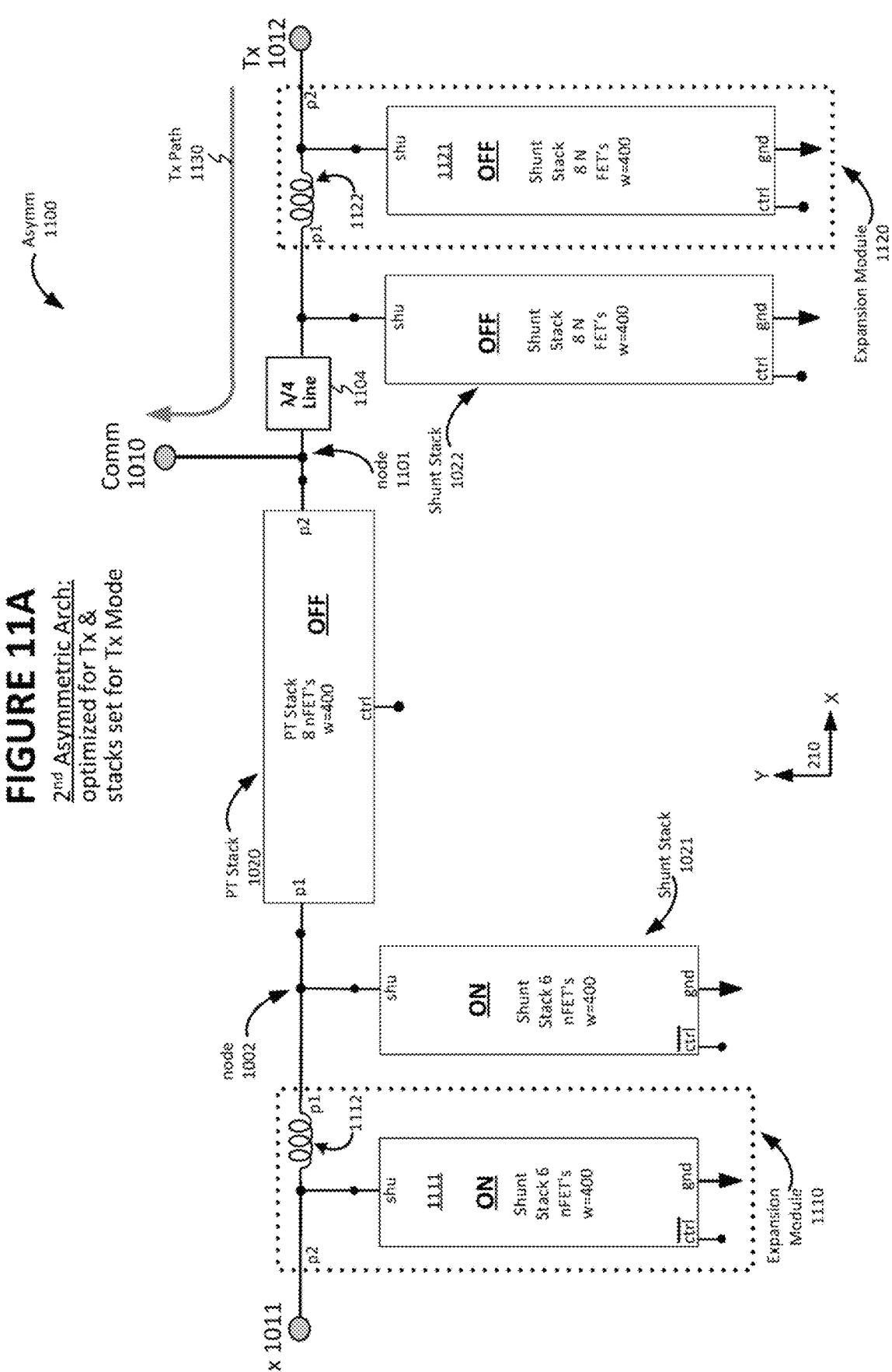
FIG. 11A presents an example RF switch 1100 using the second asymmetric architecture, optimized for transmission, and, due to the state of its stacks, in Tx Mode.

For example, consider RF switch 1100 as shown in FIG. 11A (discussed below), which has been simulated (also discussed below with reference to FIG. 13). It has been shown to achieve about 5 dB greater isolation, between Rx port 1011 and Tx Path 1130, because each of shunt stacks 1111 and 1021 has a series of 6 FET's, rather than the series of 8 FET's for each of shunt stacks 1022 and 1121.

Continuing with FIG. 10A, where shunt stack 1021 is in the ON state, since its resistance is so low (e.g., 1Ω), we can regard any transmission of RF signal, through PT stack 1020 and appearing at its connection node p1, as shunted to ground (rather than appear at port Rx 1011). Similarly, any signal appearing at Rx 1011 can be regarded as shunted to ground by the ON state of shunt stack 1021, rather than be available for passing through PT Stack 1020 towards node 1001.

For FIG. 10B, Rx 1011 can receive signal from either Common 1010, or it can receive leakage past shunt stack 1022 from Tx 1012. Shunt Stack 1021 is shown as only 6 FET's in series for the following reasons. For received signal at Common 1010, it is specified as of much less power (e.g., 1 mW) than signal for transmit input at Tx 1012 (e.g., 5 W). For signal from Tx 1012, it's power at shunt stack 1021 is already greatly attenuated by shunt stack 1022 (which simply grounds signal from Tx 1012 and does not use λ/4 path length 1004). The amount of Tx 1012 signal, reaching node 1002, is mere leakage current.

For signal originating at Rx 1011, it is either specified as non-occurring (in the specification for Receive Mode), or of much lower power than transmit signals. In either case, shunt stack 1021's series of 6 FET's provides sufficient standoff voltage.

3.1.2 Channel Width or FET's in Parallel

Choosing the channel width (of the FET's of a stack), the number of parallel stacks, or both, is driven primarily by the need for power dissipation, current carrying capacity, or both. In general, these parameters are most highly challenged when a stack is in the ON state.

For example, for FIG. 10B, the capacity of a width of 400 μm is challenged for ON pass-through stack 1020 and shunt stack 1022. Shunt stack 1022 is judged sufficient to ground essentially any transmit signal input at Tx 1012. For received signal input at Common 1010, PT stack 1020 must pass, with sufficiently low insertion loss, received signal such that it is available (per specification) at Rx 1011. This is judged achieved by PT Stack 1020's FET width of 400 μm.

In contrast, in FIG. 10A, pass-through stack 1020 and shunt stack 1022 are OFF. The width of w=400 μm is judged sufficient, for the relatively small amount of RF power originating at Tx 1012, that can pass through PT stack 1020 or shunt stack 1022. The main pathway for power is the all-transmission-line connection between Common port 1010 and Tx port 1012.

In general, a good design strategy is to have a same (or approximately same) width for all FET's of a stack. This is for the following reason. Assume a FET series for a stack has FET's of varying widths. The FET or FET's with the smallest width will limit the power dissipation and current carrying capacity of the entire stack. Therefore, even the FET's with smallest width need to have sufficient power dissipation and current carrying capacity. The extra capacity, of any FET with a larger-than-minimal-width, will be essentially unused. Therefore, most efficient use of transistor area results when all the FET's of a stack have a same (or approximately same) width—provided such width is satisfactory for the application.

3.2 a Second Asymmetric Architecture

In this section, a second asymmetric architecture is presented, that is in accordance with the techniques of the present invention.

A potential problem with the first asymmetric architecture is the parasitic capacitance of a stack's FET series.

For example, asymmetric switch 1000 (of FIGS. 10A-10B) may be applied to a situation where it provides insufficient isolation, due to the 400 μm widths, of the FET's of its shunt stacks 1021 and 1022, being insufficient.

An example discussed above is for FIG. 10B, where transmit signal at Tx 1012 is isolated from Rx Path 1031 by sufficient shunting to ground of shunt stack 1022.

As discussed above for FIG. 10A, where shunt stack 1021 is in the ON state, this shunt (in addition to the OFF state of PT stack 1020) acts to isolate the flow of signal (in either direction) between Rx 1011 and Tx Path 1030.

FIG. 11A depicts an example asymmetric switch 1100, the same as asymmetric switch 1000 of FIG. 10A (including the states of their stacks put both in Tx Mode), except the 400 μm width, of switch 1000's shunt stacks, is effectively doubled in switch 1100. On the left side of asymmetric switch 1100 (in accordance with the x axis of axes 210) an Expansion Module 1110 is added, which introduces a shunt stack 1111 parallel to shunt stack 1021. Similarly, on the right side of asymmetric switch 1100 an expansion module 1120 is added, which introduces a shunt stack 1121 parallel to shunt stack 1022. As can be seen, each Expansion Module has a pair of ports labeled p1 and p2.

(Expansion Module is introduced to present the systematic way in which the first asymmetric architecture can be converted into second asymmetric architecture, or the second asymmetric architecture expanded further. It is a useful organizational tool for Electronic Design Automation software, discussed below.)

Asymmetric switch 1000 is depicted as not needing an explicit inductor component to achieve the transmission line effect (e.g., 50 ohms) by balancing parasitic capacitances. For asymmetric switch 1100, however, each expansion module includes an inductor to balance the parasitic capacitance added by that expansion module's FET series.

As is known, the impedance of a transmission line can be determined with the formula $$\sqrt{L/C}.$$

When C is increased by increased parasitic capacitance, the L must be increased to maintain the same ratio and resulting impedance. Therefore, in addition to shunt stack 1111, expansion module 1110 includes inductor 1112. Similarly, in addition to shunt stack 1121, expansion module 1120 includes inductor 1122.

As can be seen, each Expansion Module Includes a port p1 and p2. With respect to components inside the Expansion Module, p1 is connected directly to only the inductor (e.g., inductor 1112 for Expansion Module 1110), while p2 is directly connected to the inductor (at its other terminal from that used by p1) and the shunt stack.

Figure 11B:
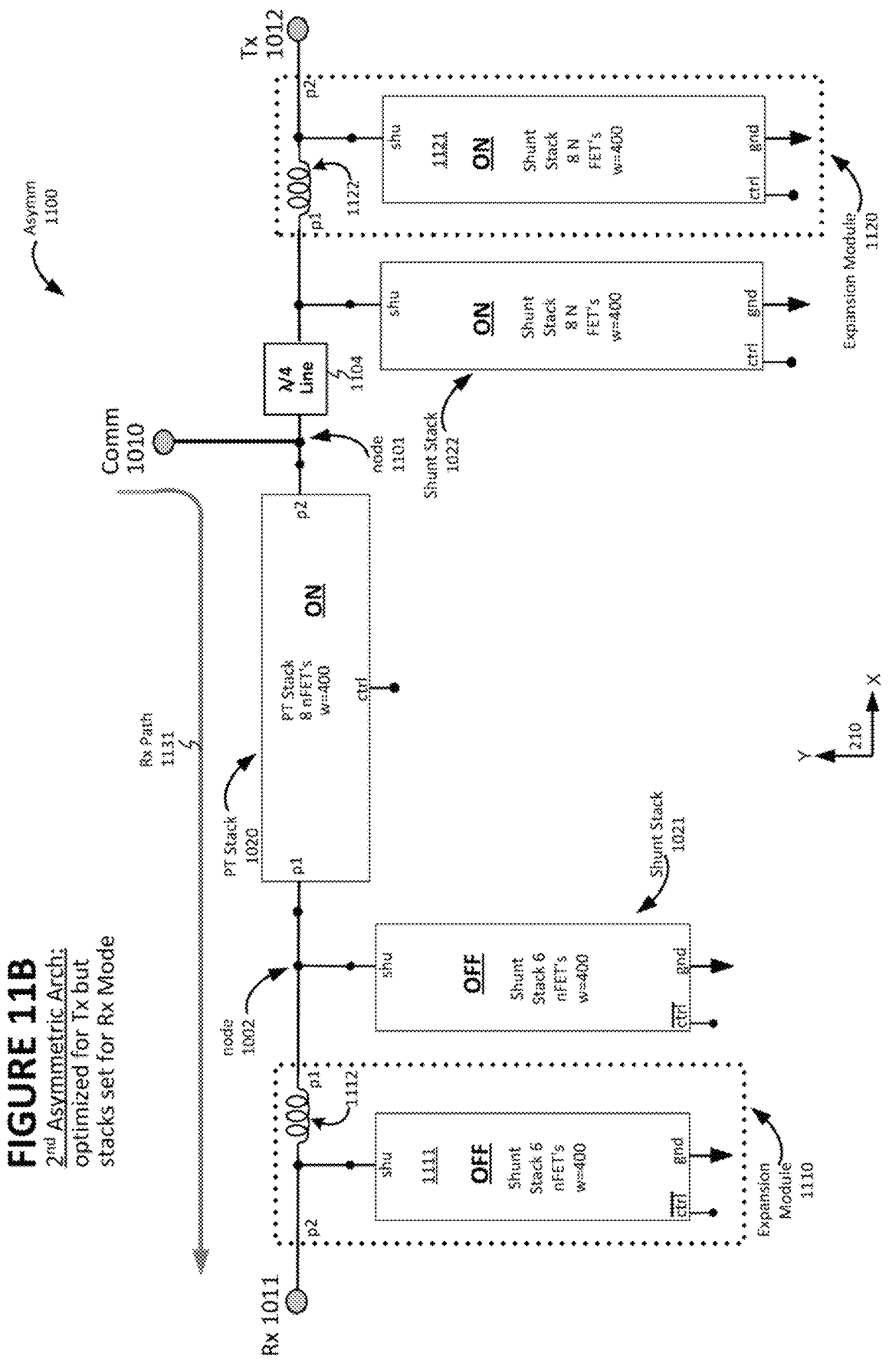
FIG. 11B depicts the same example asymmetric switch 1100 of FIG. 11A, but in Rx Mode due to the state of its stacks being opposite to the states of FIG. 11A.

FIG. 11B depicts the same example asymmetric switch 1100 of FIG. 11A, but in Rx Mode due to the state of its stacks (opposite to the states of FIG. 11A). As FIG. 11A corresponds to FIG. 10A, FIG. 11B corresponds to asymmetric switch 1000 of FIG. 10B (both in Rx Mode). Because FIGS. 11A and 11B differ only in their state, both depict the same switch 1100. Switch 1100 is the same as switch 1000, except the 400 μm width, of switch 1000's shunt stacks, is effectively doubled for switch 1100 by its Expansion Modules 1110 and 1120.

There are substantial advantages to having a net channel width of 800 μm distributed across two stacks of 400 μm. The two shunt stacks provide the same power dissipation and current carrying capacity as a single series of 800 μm FET's. However, because the capacitance is distributed along a tuned transmission line, the higher frequency response, of a single series of 400 μm FET's, is more closely maintained.

The shunt stack and inductive pair, on either side of asymmetric switch 1100, is organized as an expansion module to emphasize the repeatability of this technique. For example, should even greater power dissipation and current carrying capacity be required, a second expansion module can be added on either side.

For example, on the left side of asymmetric switch 1100, and on the left side of expansion module 1110, a second expansion module can be added. If this expansion module is also a stack of 400 μm FET's, then the net power dissipation and current carrying capacity of the left side of switch 1100 is equivalent to a single stack of FET's, where each FET has a channel width of 1200 μm. As with the addition of expansion module 1110, the second expansion module is also balanced between its parasitic capacitance and inductance. The balancing permits maintenance of a 50 ohm transmission line, while the frequency response is kept much closer to that of a single series of 400 μm FET's than would be possible with a single series of 1200 μm FET's.

For the right side of asymmetric switch 1100, mutatis mutandis, a second expansion module can also be added. The right-side second expansion module can be added at the right side of expansion module 1120.

A third area, of expansion of the design of switch 1100, can be the PT Stack coupling the left and right sides of the switch. For example, should greater power-dissipation or current-carrying capacity of PT stack 1020 be required, an expansion PT stack can be added in parallel with PT stack 1020. Unlike the addition of an expansion shunt stack, a PT stack, added as an expansion to a prior PT stack, does not necessarily need to be paired with an inductive element.

3.3 Optimized for Receive

Figure 12A:
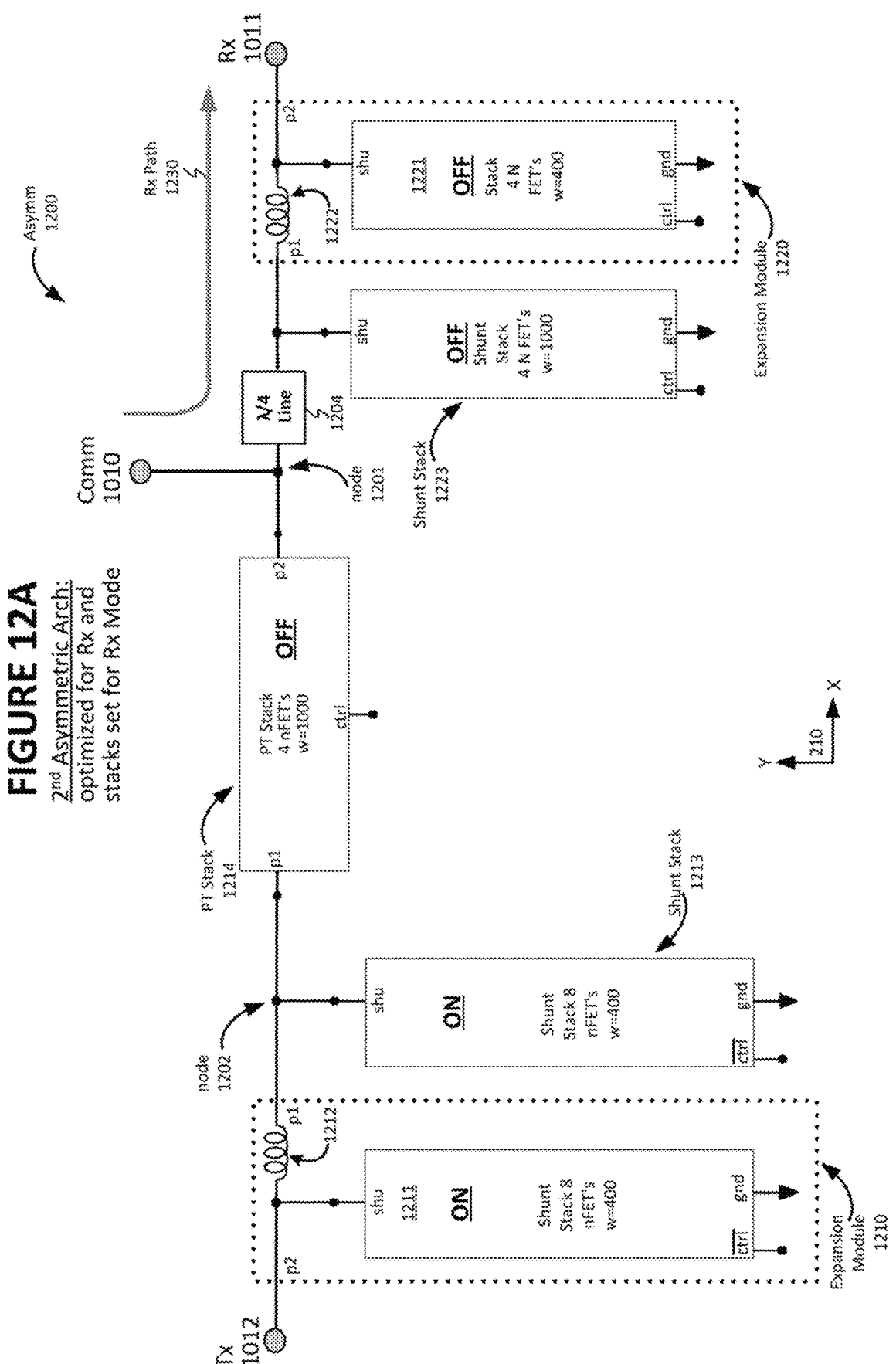
FIGS. 12A-12B present another example asymmetric switch 1200 using the same second asymmetric architecture as switch 1100, but switch 1200 is optimized for reception.
Figure 12B:
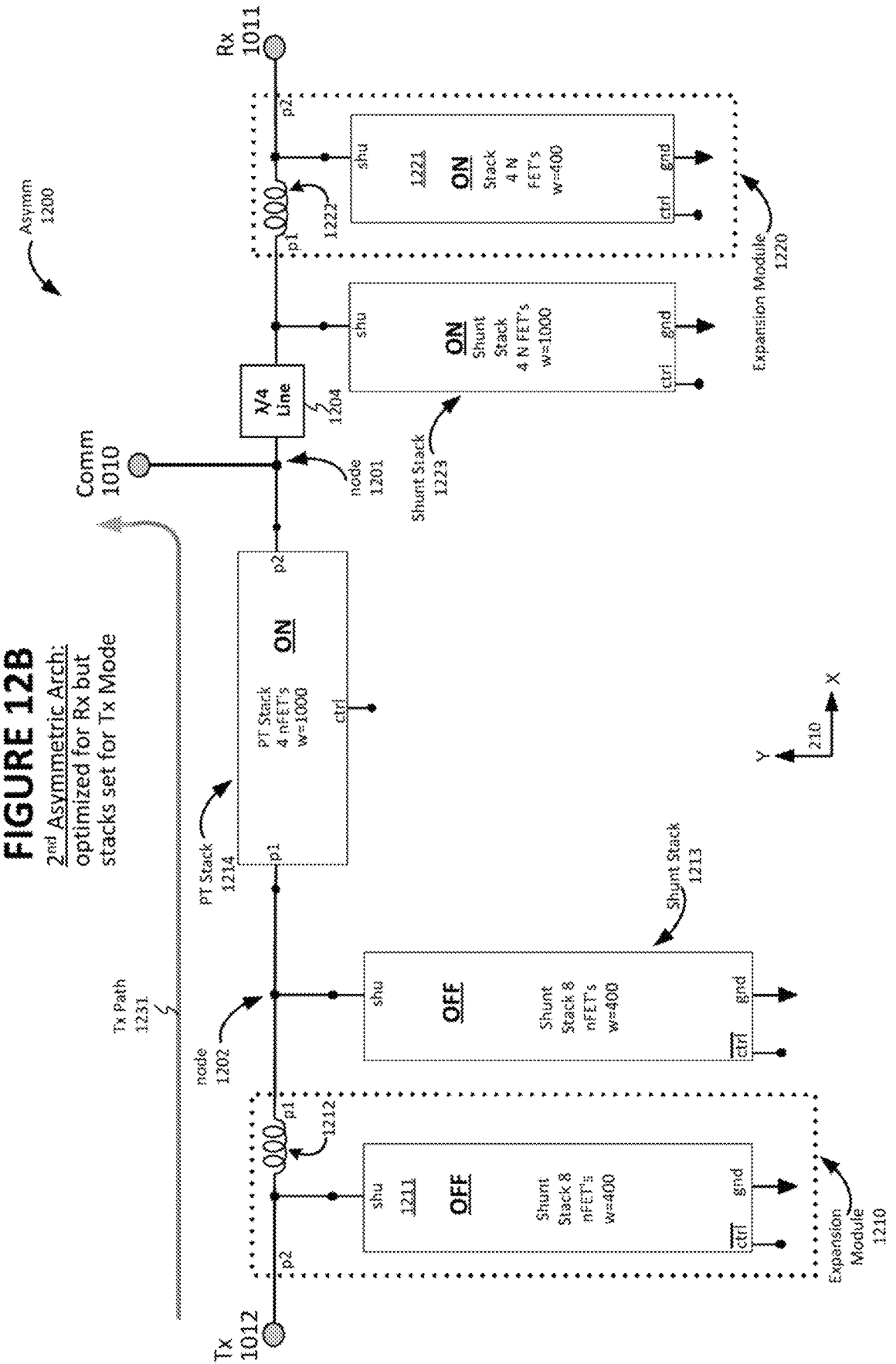

In this section, presentation of the second asymmetric architecture is continued, but this time with a switch optimized for receive or Rx. FIGS. 12A-12B present an example asymmetric switch 1200. FIGS. 12A-12B can be compared, respectively, to FIGS. 11A-11B.

As can be seen, the basic topology of switch 1200 is the same as that of switch 1100. However, some of the important differences include:

The locations of the transmit and receive ports are swapped. While Tx port 1012 is on the right side of switch 1100, it is on the left side of switch 1200. Also, Rx port 1011 is on the left side of switch 1100, but is on the right side for switch 1200.

The swapping provides the Common port 1010 to Rx port 1011 connection, for switch 1200, with the lowest insertion loss path, which is why switch 1200 is regarded as optimized for receive mode. The connection is referenced in FIG. 12A as Rx path 1230, and it flows through the same hardware topology as Tx path 1130 in FIG. 11A. However, as can be appreciated, the directionality of the signal for Rx path 1230 is opposite to that of Tx path 1130. (Should a designer desire an Rx Path of opposite direction to that of Rx Path 1230, the hardware of Rx Path 1230 remains a 50 Ohm transmission line.)

Conversely, the swapping provides the Tx port 1012 to Common port 1010 connection with the higher insertion loss path. This path is labeled Tx Path 1231 in FIG. 12B. Compared with Rx path 1131 of FIG. 11B, Tx Path 1231 flows through the same hardware topology. However, as can be appreciated, the directionality of the signal for Tx path 1231 is opposite to that of Rx path 1131. (Should a designer desire a Tx Path of opposite direction to that of Tx Path 1231, the hardware of Tx Path 1231 operates essentially the same.)

The number of FET's in series, for forming the stacks, can differ. For example,

Shunt stacks 1111 and 1021, of switch 1100, correspond to shunt stacks 1211 and 1213 of switch 1200. However, while each of shunt stacks 1111 and 1021 has a series of 6 FET's, each of shunt stacks 1211 and 1213 has a series of 8 FET's. This is due to the higher power (and therefore higher voltage) nature of Tx path 1231 compared with Rx path 1131. As discussed above (e.g., switch 1000 in Tx Mode, per FIG. 10A), because of the need to handle 5.0 W signals in Transmit Mode (while still interfacing with 50 ohm transmission lines), the peak RF voltage (or $v_p$), to be blocked by each of shunt stacks 1211 and 1213, is 22.35 v. The portion of this voltage, to be handled by each FET across a stack of eight FET's, is 2.8 v. This works because the standoff voltage of each FET, for the example process discussed herein, is 3.0-3.5 v.

Shunt stacks 1022 and 1121, of switch 1100, correspond to shunt stacks 1223 and 1221 of switch 1200. However, while each of shunt stacks 1022 and 1121 has a series of 8 FET's, each of shunt stacks 1223 and 1221 has a series of 4 FET's. Once again, this is due to shunt stacks 1022 and 1121 needing to stand off higher Tx voltages than the Rx voltages stood off by shunt stacks 1223 and 1221.

Pass-through stack 1020 of switch 1100 corresponds to pass-through stack 1214 of switch 1200. However, pass-through stack 1020 has 8 FET's in series, while pass-through stack 1214 has 4 FET's in series. This is because switch 1100, in transmit mode, has large transmission signals (see Tx Path 1130) for blocking by PT Stack 1020. In comparison, when switch 1200 is in receive mode, PT stack 1214 is either blocking the lower power of received signals (see Rx Path 1230), or blocking the transmit signals (see Tx Path 1231) after they have been attenuated by shunt stacks 1211 and 1213.

The width of the FET's in series, for forming the stacks, can differ. For example, Shunt stack 1022 of switch 1100 corresponds to shunt stack 1223 of switch 1200. However, the FET's of stack 1022 have a width of 400 μm, while the FET's of stack 1223 have a width of 1000 μm. This is because the higher power transmit signals are assigned to the less efficient path (see Tx Path 1231) in transmit mode. Shunt 1223, in particular, must be capable of absorbing 2-3 W, when the transmit signal (as shown in FIG. 12B) initially divides at node 1201. Most of the effect of "seeing" an open, when looking rightwards from node 1201, is accomplished by shunt stack 1223, which is why shunt stack 1221 of expansion module 1220 is kept at the 400 μm channel width. For switch 1100, the lower power receive signals are routed through the less efficient path (see path 1131) and the "open" such signals see formed with stack 1022.

Pass-through stack 1020 of switch 1100 corresponds to pass-through stack 1214 of switch 1200. However, pass-through stack 1020 has FET's of width 400 μm, while pass-through stack 1214 has FET's of width 1000 μm. As in the just-above comparison of shunt stacks, the difference is due to the high power transmit signals being assigned to the less efficient path for switch 1200 (i.e., see FIG. 12B, Tx Path 1231), while the low power receive signals are assigned to the less efficient path for switch 1100 (i.e., see FIG. 11B, Rx Path 1131).

The operation of switch 1200 can now be further described as follows.

3.3.1 Receive Mode

As has been discussed above, asymmetric switch 1200 is optimized for the receiving of signals. As depicted in FIG. 12A, switch 1200 is shown in Receive (or Rx) Mode, as a result of the following states of its five stacks:

OFF state: stacks 1214, 1223, and 1221

ON state: stacks 1211 and 1213.

The difference in the state can be accomplished by providing control signals to the OFF stacks complementary to those applied to the ON stacks. This is indicated in the diagrams by having the control input for certain stacks be labeled ctrl while for other stacks it is labeled ̄c̄t̄r̄l̄. (Switch 1200 is also in Receive Mode because of the above-discussed swapping of location of the ports Tx 1012, and Rx 1011.)

For signals traveling between Common port 1010 and Rx port 1011, because shunt stacks 1223 and 1221 are OFF, the $\lambda/4$ path length, between node 1201 and the ground connection of shunt stack 1223, is unused (as discussed above, the $\lambda/4$ path length is indicated by box 1204). Therefore, Rx Path 1230 (or an Rx Path traveling opposite to Rx Path 1230) acts simply as a transmission line, and causes the least amount of insertion loss.

The OFF state of PT stack 1214, combined with the ON state of shunt stacks 1211 and 1213, keep Tx port 1012 isolated from Rx Path 1230. For signals that would otherwise travel from Rx Path 1230 towards Tx port 1012, they are first attenuated by PT Stack 1214. (As calculated just below, a series of four FET's provides more than sufficient standoff voltage capability for PT Stack 1214.) Leakage past stack 1214 (from terminal p2 to p1) is shunted to ground by the ON state of stacks 1211 and 1213.

The converse case is the blocking of signals, input to port Tx 1012, from affecting Rx Path 1230:

As has been discussed above, for this example, the signals for transmit are assumed much larger than signals received (e.g., a 5 W signal for transmission compared with receiving a signal of 1 mW).

While switch 1200 is in Receive Mode (as Shown in FIG. 12A), a transmit signal input at port Tx 1012 is first shunted to ground by the ON state of shunt stacks 1211 and 1213. The addition of shunt stack 1211 is accomplished by the addition of Expansion Module 1210. The addition of shunt stack 1211 effectively doubles the shunting capability of shunt stack 1213. Specifically, the addition of shunt stack 1211 increases total channel width (causing shunting) from 400 µm to 800 µm. Because the 800 µm width is distributed, however, a frequency-handling capacity closer to 400 µm is maintained.

Transmission signal leaking past shunts 1211 and 1213 is further blocked by the OFF state of PT stack 1214. Because most of the transmission signal has already been absorbed by shunt stacks 1211 and 1213, the four FET's of PT stack 1214 are sufficient (i.e., provide sufficient standoff voltage) to block the transmission signal's remaining power.

As mentioned above, there is only a series of four FET's, for PT stack 1214, and each of shunt stacks 1223 and 1221, while shunt stacks 1211 and 1213 each has a series of eight FET's. The lower number of FET's, for stacks directly connected to Rx Path 1230, is possible because of the generally less power of received signals compared with those to be transmitted (e.g., see Tx Path 1231).

In general, it is not unusual for received signals to have a power level at least three orders of magnitude less than those transmitted (or more). For the purposes of this example, the received signal is assumed to be 1.0 mW. Going through the same calculations as performed above, but with a signal of 1.0 mW rather than 5.0 W, the result is as follows:

We will use the following formula:

$$v_{rms} = \sqrt{w \times r}$$

Where:
w is power in watts (e.g., $1 \times 10^{-3}$ w) and r is impedance in ohms (e.g., 50Ω)

$$v_{rms} = \sqrt{\left(1 \times 10^{-3}\right) \times 50}$$
$$v_{rms} = \sqrt{0.05}$$
$$v_{rms} = 0.224v$$

To consider the necessary standoff voltage, one needs to know the peak voltage ($v_p$), where:

$$v_p = v_{rms} \times \sqrt{2} = 0.316v$$

With 4 series transistors for each of stacks 1223 and 1221, the amount of peak voltage to be withstood by each FET is as follows:

$$v_{p/FET} = \frac{v_p}{4\,FET's} = 0.08_{v_{p/FET}}$$

Therefore, for this example, a series of 4 FET's is actually over design, for an OFF stack merely needing to withstand the power of received signals.

3.3.2 Transmit Mode

The transmit operation of switch 1200, for which it has not been optimized, can now be described with respect to FIG. 12B.

As depicted in FIG. 12B, switch 1200 is shown in Transmit (or Tx) Mode, as a result of the state of its five stacks:

ON state: stacks 1214, 1223, and 1221

OFF state: stacks 1211 and 1213.

As can be appreciated by a comparison of FIGS. 12A and 12B, the stack states of FIG. 12B are determined by just applying the opposite of the control signal applied to each stack in FIG. 12A. A signal to be transmitted can enter at port Tx 1012 and exit at Comm 1010, in accordance with Transmit Path 1231. (Should a designer wish for transmitted signals to operate in the opposite direction, they can enter at Common 1010 and exit at Tx 1012.)

When a signal for transmit enters at port Tx 1012, because shunt stacks 1211 and 1213 are OFF, Tx Path 1231, from Tx 1012 to the p1 port of PT stack 1214, acts as a transmission line, causing little insertion loss.

However, during travel though PT stack 1214 (which is in the ON state), from port p1 to p2, a signal for transmit does undergo insertion loss. The need for Tx Path 1231 to pass-through series components, while Rx Path 1230 is entirely transmission line, causes Rx Path 1230 to have less insertion loss than Tx Path 1231. This lower insertion loss is one reason (the other being higher isolation) why switch 1200 is classified as optimized for Receive Mode.

Regarding signal flow, between Tx Path 1231 and Rx 1011, isolation is accomplished by the ON state of shunt stacks 1223 and 1221. Their ON state, combined with a λ/4 path length (between node 1201 and the ground connections of stacks 1223 and 1221), cause signal attempting to flow rightwards, from node 1201, to "see" the electrical equivalent of an open circuit. The creation of an open circuit is accomplished mainly by shunt stack 1223. Such primary responsibility, combined with the need for large transmission signals to see an open circuit, is why 1223 is depicted with FET's with 2.5 times the channel width (i.e., 1000 µm) of those in shunt stack 1221 (i.e., 400 µm channel width).

Since stacks 1223 and 1221 are ON, their resistance is very low (as discussed above, assumed 1Ω each), meaning a small amount of voltage drop across each. Therefore, even though absorption of transmission signals is a relatively high power situation (compared with receive signals) a series of four FET's is sufficient for each of the 1223 and 1221.

Compared with the two levels of isolation of Tx 1012 from Rx Path 1230 (for which switch 1200 is optimized), it can be observed that the isolation of Tx Path 1231 from Rx 1011 will be less. The cause of this difference is at least due to the following:

Isolation, of signals between Tx 1012 and Rx Path 1230, (as discussed above) is the result of two types of mechanisms: the shunting of stacks 1211 and 1213, and the OFF state of PT stack 1214.

However, isolation, of signals between Rx 1011 and Tx Path 1231, is mainly the result of one mechanism for each direction. Due to the ON state of shunt stack 1223, large transmission signals, attempting to travel rightwards from node 1201, "see" an open circuit. Isolation of signals from Rx 1011, from affecting Tx Path 1231, is accomplished by the shunting of stacks 1223 and 1221.

3.4 Example Performance

The predicted asymmetric performance improvements (both for insertion loss and isolation) has been verified by simulation of asymmetric switch 1100, and the results compared with a state-of-the-art back symmetric switch.

Please see loss Table 1300 of FIG. 13.

The first two rows address insertion loss, with the first row showing (at column B, "With Invention") insertion loss when RF switch 1100 is in Tx Mode, and the second row showing insertion loss for switch 1100 (column With Invention) when in Rx Mode. Since switch 1100 is optimized for Transmit Mode, we would expect an insertion loss lower in Tx compared with Rx Mode, and this is indeed the case. We see that insertion loss in Tx Mode is only 0.65 dB, compared with 1.8 dB for Rx Mode.

It is instructive to compare these numbers to measurements from a state-of-the-art symmetric RF switch (at column C, "Symmetric Design"). As can be seen, the symmetric design has the same loss of 1.0 dB in either Tx or Rx Mode. Thus, usage of the inventive second asymmetric architecture trades superior performance in Tx Mode (compared with "Symmetric Design") for worse-than-Symmetric-Design performance in Rx Mode. This trade-off may be useful, for example, if it is much more important to reduce the generation of heat in high-wattage Transmit Mode, than obtain the highest sensitivity possible in Receive Mode.

As has been discussed above, even when a switch is in a particular Mode (e.g. Tx Mode), the connection thus enabled can carry signals in either direction. The bidirectionality of the measurements of Table 1300 is indicated by the bidirectional arrows (i.e., ← →). For example, as discussed above with respect to FIG. 11A, a Tx Path 1130 is shown pointing from Tx 1012 to Common 1010. However, the same measurement (i.e., 0.65 dB) of Table 1300 applies if RF switch 1100 is used with a signal path pointing from Common 1010 to Tx 1012.

Table 1300 also includes measurements of electrical isolation. Rows 3-4 present isolation levels when switch 1100 is in Tx Mode, while rows 5-6 present isolation levels for Rx Mode.

For Tx Mode, rather than show isolation of Rx 1011 from Tx Path 1130, it is broken down into Rx 1011's isolation from Common 1010 (49 dB) and Rx 1011's isolation from Tx 1012 (50 dB). It can be appreciated that the isolation of Tx 1012 may be a little higher than Common 1010 because, in addition to the isolation mechanisms for Common 1010, Tx 1012 has the RF shunting of shunt stacks 1022 and 1121. However, a more important point is that the isolation values are very close to each other (i.e., vary by only about 2%), and we may regard the isolation, of Rx port 1011 from Tx Path 1130, as approximately 49.5 dB.

As discussed above, the addition of one or more shunt stacks, between a port to be isolated and the isolation provided by a pass-through stack, is a new invention dramatically increasing electrical isolation. In the case of FIG. 11A, the inventive shunt stacks 1111 and 1021 are inserted between Rx port 1011 and the p1 port of PT stack 1020. Measurements of simulated asymmetric switch 1100 indicate that, without shunt stacks 1111 and 1021, the isolation of port 1011 drops by about three orders of magnitude. More specifically, the 49.5 dB loss, indicated by rows 3 and 4 of Table 1300, drops to around 20 dB.

For Rx Mode (i.e., see FIG. 11B), rather than show isolation of Tx 1012 from Rx Path 1131, it is broken down (per rows 5-6) into Tx 1012's isolation from Common port 1010 (i.e., 38 dB) and Tx 1012's isolation from Rx 1012 (i.e., 40 dB). Once again, as expected, the isolation of Rx 1011 is a little higher than the isolation of Common 1010 (because in addition to all the isolation mechanism for Common 1010, Rx 1011 has some losses through PT stack 1020, and some RF losses from shunt stacks 1111 and 1021). However, once again, a more important point is that the isolation values are close to each other, and we may regard the isolation, of Tx port 1012 from Rx Path 1131, as approximately 39 dB.

A main point, regarding these isolation measurements, is to compare them to the Symmetric Design. The Symmetric Design provides a uniform isolation of 38 dB across all measurements (i.e., see rows 3-6, Table 1300). Therefore, isolation is about 11.5 dB (or about 30%) higher in Tx Mode (i.e., 49.5 dB) than it is in in the Symmetric Design. Interestingly, Isolation from switch 1100, in Rx Mode, is also a (small) improvement over the Symmetric Design (i.e., around 39 dB, about 3% higher than 38 dB).

Revisiting insertion loss, Tx Mode is optimized for an insertion loss about 35% lower than the Symmetric Design, at the expense of about 80% greater insertion loss in Rx Mode (once again compared to the Symmetric Design).

The final row of Table 1300 (i.e., row 7) addresses the power handling of RF switch 1100, and the Symmetric Design (of column C), relative to the 5 W transmission signals. The unit, dBm, uses decibels to specify a number of milliwatts. In the case of the Symmetric Design, number of milliwatts specified by 37 dB is $10^{3.7}$, or 5000. Therefore, the Symmetric Design is able to handle exactly the 5 W required by the specification for transmit signals. However, With Invention (column B), the number of milliwatts specified by 38 dB is $10^{3.8}$, or 6300. Therefore, utilization of the invention for RF switch 1100 increases power handling for transmit signals to 6.3 W, which is 26% higher than the wattage enabled with the Symmetric Design.

4 EDA SOFTWARE

The invention includes sufficient systemization, for at least the design of an RF switch enabling use of a same antenna for transmission or reception, such that an implementation as Electronic Design Automation (EDA) software can be obtained. In this framework, the RF switch can be described as follows:

Having a common port to which the antenna is connected.

Having first and second selectable ports, to which the common port can be connected.

For a first signal at the first selectable port, signal flow is from the common port to the first selectable port, corresponding to the first signal being a received signal.

For a second signal at the second selectable port, signal flow is from the second selectable port to the common port, corresponding to the second signal being a signal for transmission.

The main parameters for input include:

The following specifications (typically by a circuit or system designer):

An asymmetric specification of whether the transmitted or received signal has priority of optimization ("the Priority Signal"), where optimization is measured as reduced insertion loss, increased isolation of the unused selectable port, or both.

The specification of frequency and bandwidth of each signal for potential routing through the RF switch. In general, these are expected to be in the millimeter wave range (e.g., ≥10 GHZ).

The impedance of the electrical environment (e.g., transmission lines) to which the RF switch is connected (e.g., impedance of 50 Ohms).

The power level of each of the first and second signals for routing through the RF switch. For example, receiving signals of 1 mW (or less), and transmitting signals of 5 W (or less).

For a first semiconductor process utilized (e.g., SOI), important characteristics include:

Standoff voltage of a FET.

Resistance of a single FET in the ON state (e.g., 0.1Ω).

Resistance of a single FET in the OFF state (e.g., 50 KΩ).

The following based on channel width:

Parasitic capacitance of a FET, increasing with channel width.

Power dissipation and current carrying capacity of a FET, increasing with channel width.

An EDA tool can start with attempting to satisfy an end-user's main parameters with the first asymmetric architecture, such as that of switch 1000, as shown in FIGS. 10A and 10B (discussed above).

Figure 10C:
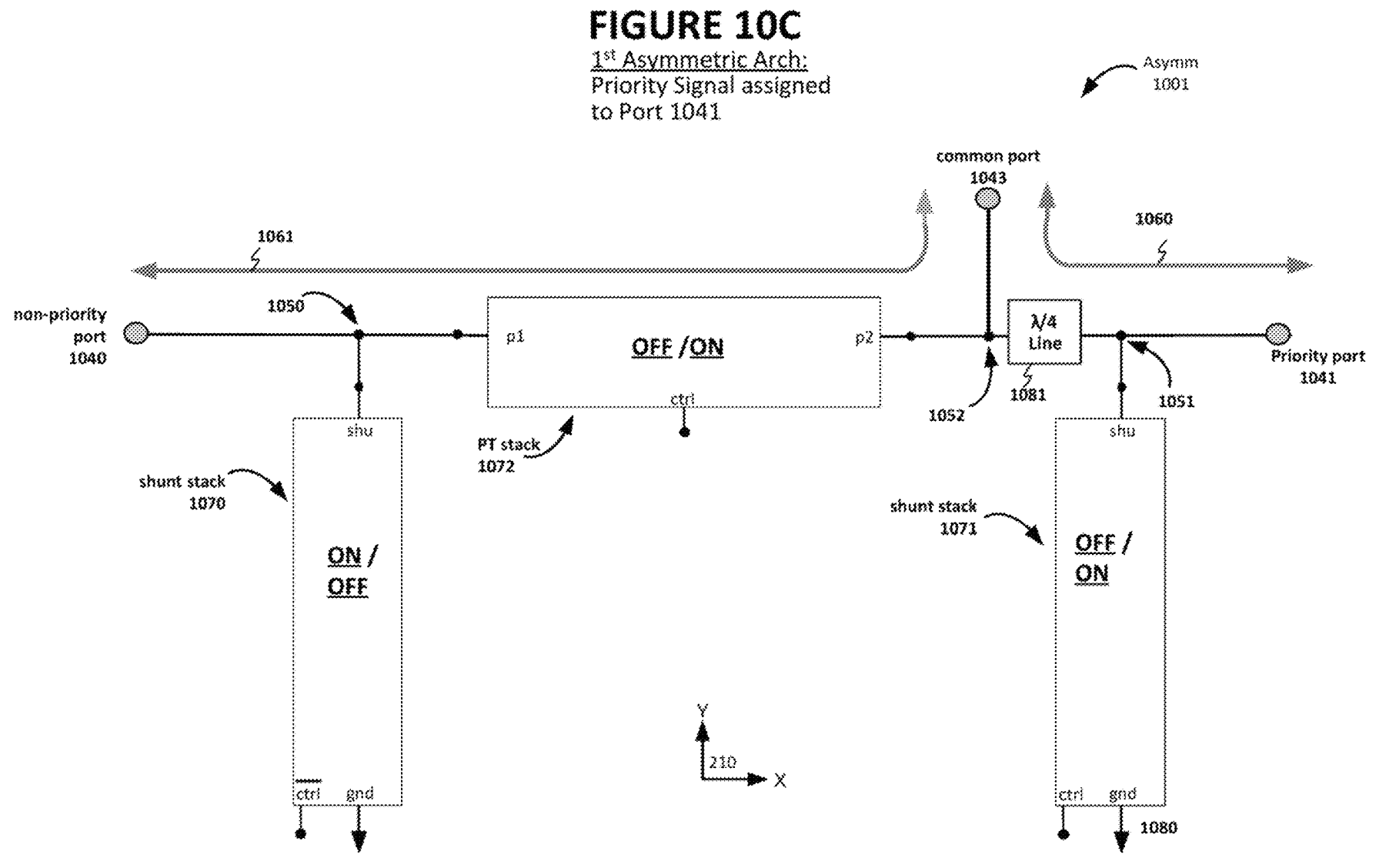

A more generic view of the first asymmetric architecture (indicated as asymmetric RF switch 1001) is shown in FIG. 10C. The signal to be the Priority Signal is assigned to port 1041:

If the transmit signal is assigned, it flows from port 1041, along priority path 1060, to Common port 1043. In this case receive, the non-Priority Signal, is assigned to port 1040. The received signal flows from port 1043, along non-priority path 1061, to port 1040.

If the received signal is assigned, then it flows from Common port 1043, along priority path 1060, to port 1041. In this case transmit, the non-Priority Signal, is assigned to port 1040. The signal for transmit flows from port 1040, along non-priority path 1061, to port 1043.

Regardless of whether transmit or receive is the Priority Signal, whether priority path 1060 or non-priority path 1061 is active depends on the state of the stacks of RF switch 1001. As can be seen in FIG. 10C, each stack can be in one of the two alternative states:

If the first alternative state is chosen for each stack, then priority path 1060 is active. This means the stacks are in following states: ON for shunt stack 1070, OFF for shunt stack 1071, and OFF for pass-through stack 1072.

If the second alternative state is chosen for each stack, then non-priority path 1061 is active. This means the stacks are in the following states: OFF for shunt stack 1070, ON for shunt stack 1071, and ON for pass-through stack 1072.

Once the Priority Signal is chosen, initial implementations of stacks 1070, 1071, and 1072 can be determined. This can be based on such parameters as the specified power levels of the signals for transmit or receive, transmission line impedance, and characteristics of the semiconductor process utilized. Such process characteristics include the standoff voltage of a FET, a FET's power dissipation capacity based on channel width, and a FET's ON and OFF resistances.

The following two key aspects, for each stack implementation, can be determined automatically by the EDA tool:

The number of FET's in series (based on expected peak voltage $v_p$ when the stack is in its high resistance OFF state). Based on the standoff voltage of an individual FET, the necessary series length of an OFF stack, to withstand its $v_p$, can be determined.

The channel width required (based on the expected maximum level of power dissipation when a stack is ON).

Channel width can be converted to parasitic capacitance, and further converted to frequency response. If higher frequency response is needed, channel width can be divided with Expansion Modules (which may include an inductor to maintain transmission line impedance), in accordance with the second asymmetric architecture (discussed above). The second asymmetric architecture is used to distribute parasitic capacitance along a transmission line.

The second asymmetric architecture can either be like switch 1100 (Priority Signal is transmit signal), or switch 1200 (Priority Signal is received signal).

For either the first or second asymmetric architectures, λ/4 path length determination is necessary. The λ/4 path length technique has the advantage of providing highly optimized (i.e., lessened) insertion loss for the priority path, while still providing sufficient isolation for many types of non-priority paths. The range of acceptable λ/4 path lengths is determined from the frequency and bandwidth of the signal chosen for optimization.

For any of the above-described steps in the design process, capability can be added to the EDA tool to produce output for the end user. Such output can include a diagram or other graphical presentation to the end-user, a representation suitable for circuit simulation, or both.

5 GLOSSARY OF SELECTED TERMS connected: defined herein as having the same meaning as, and interchangeable with, "coupled," for technical purposes, legal purposes, or both.

FET: Field Effect Transistor insertion loss: For a pair of nodes, its insertion loss is the amount of signal lost, between the signal entering a switch, at a first node of the node pair, and exiting the switch (at a second node of the node pair).

mW: milliwatt pass-through stack: 2 or more transistors, coupled in series, through which is passed a signal.

resistor: unless context specifically indicates otherwise, defined herein as a resistor, or any resistive network. A resistive network can include two or more resistors, one or more electronic components, or both. Electronic component can include any device relying on the use of a semiconductor, such as (but not limited to): any type of diode, or transistor (FET or otherwise).

Rx: Abbreviation for, and can be used interchangeably with, receive or receiver.

selectable ports: Each selectable port of a switch is a port to which a common port may choose to connect.

shunting stack: 2 or more transistors, coupled in series, through which a signal is directed to or from a power rail, such as ground or Vdd.

SOI: A Silicon on Insulator process for the manufacture of integrated circuits.

specification: a specification is typically written by a human circuit or project designer. Among other things, it can specify the environment (typically electrical, but can include other parameters such as temperature) in which a switch is to operate. When a specification is available, rather than use a more generic (e.g., symmetric) switch, the switch can be optimized for meeting the specification. For example, differences between two different signal types (e.g., received signals or transmit signals) can be the result of a design specification. Similarly, a design specification can specify the prioritization of a first signal type over a second, for minimized insertion loss, maximized isolation, or both.

Tx: Abbreviation for, and can be used interchangeably with, transmit, transmission, or transmitter.

6 SUMMARY

While the invention has been described in conjunction with specific embodiments, it is evident that many alternatives, modifications and variations will be apparent in light of the foregoing description.

For example, while the embodiments presented use N-channel FET's, mutatis mutandis, P-channel FET's can be used. Other embodiments can use both N-channel FET's and P-channel FET's. In still further embodiments, transistors types other than FET can be utilized. Implementations of shunt stacks involving the use of P-channel FET's may be connected between a circuit node of the asymmetric switch and a power rail other than ground (e.g., a positive voltage power rail rather than ground).

Embodiments have been discussed with respect to the use of antennas. However, the RF switches presented herein can be used to guide signals from any type of RF source, provide signals to any type of system requiring RF signal input, or both. 5

Accordingly, the invention is intended to embrace all such alternatives, modifications and variations as fall within the spirit and scope of the appended claims and equivalents.

What is claimed is:

1. An electronic design automation method for generating a millimeter-wave capable RF switch, comprising:

accepting input specifying whether a receive signal or a transmit signal is selected the priority signal for optimization, the unselected signal being the non-priority signal, wherein both the receive and transmit signals are millimeter waves;

accepting input specifying the transmit signal selected for the priority signal;

accepting input specifying a first power level for the receive signal and a second power level for the transmit signal;

accepting input specifying a first semiconductor process for implementation of the millimeter-wave capable RF switch;

accepting input specifying a first impedance level for the transmission lines of the millimeter-wave capable RF switch;

determining a first shunt stack peak voltage, across an off first shunt stack, and a first pass-through stack peak voltage, across an off first pass-through stack, for when the millimeter-wave capable RF switch is in transmission mode, wherein a second port of the first pass-through stack, the first shunt stack, a common port and a first selectable port are connected to a second node;

determining the first shunt stack peak voltage, and the first pass-through stack peak voltage, with use of the second power level and the first impedance level;

determining a first shunt stack number of series field effect transistors needed for the first shunt stack peak voltage;

determining a first pass-through stack number of series field effect transistors needed for the first pass-through stack peak voltage, wherein the first shunt stack number of series field effect transistors, and the first pass-through stack number of series field effect transistors are determined with use of a standoff voltage of a field effect transistor for the first semiconductor process;

determining a second shunt stack peak voltage, across an off second shunt stack, for when the millimeter-wave capable RF switch is in receive mode, wherein a first port of the first pass-through stack, the second shunt stack, and a second selectable port are connected to a first node;

determining a second shunt stack number of series field effect transistors needed for the second shunt stack peak voltage;

determining a necessary second shunt stack channel width, when the second shunt stack is on, in transmission mode for the millimeter-wave capable RF switch;

determining a necessary first shunt stack channel width, when the first shunt stack is on, and first pass-through stack channel width, when the first pass-through stack is on, in receive mode for the millimeter-wave capable RF switch is in receive mode; and outputting the produced design for the millimeter-wave capable RF switch.

2. The electronic design automation method of claim 1, further comprising:

determining a gate resistor for each gate of each field effect transistor comprising the first pass-through series of field effect transistors of the first pass-through stack;

determining a resistance, for each gate resistor, sufficiently high to prevent a back current, of a first field effect transistor of the first pass-through series, from affecting the state of any other field effect transistor comprising the first pass-through series; and determining a resistance, for each gate resistor, sufficiently low to permit the state, of any field effect transistor comprising the first pass-through series, to switch with sufficient rapidity.

3. The electronic design automation method of claim 1, further comprising:

determining a gate resistor for each gate of each field effect transistor comprising the first shunt series of field effect transistors of the first shunt stack;

determining a resistance, for each gate resistor, sufficiently high to prevent a back current, of a first field effect transistor of the first shunt series, from affecting the state of any other field effect transistor comprising the first shunt series; and determining a resistance, for each gate resistor, sufficiently low to permit the state, of any field effect transistor comprising the first shunt series, to switch with sufficient rapidity.

4. The electronic design automation method of claim 1, further comprising:

determining a source-to-drain resistor across each source and drain of each field effect transistor comprising the first shunt series of field effect transistors of the first shunt stack;

determining a source-to-drain resistance, for each source-to-drain resistor, approximately the same as the resistance of any other source-to-drain resistor for any other field effect transistor comprising the first shunt series;

determining a resistance, for each source-to-drain resistor, sufficiently high to permit a necessary level of isolation, for the first shunt stack, when the gates of the first shunt stack receive a signal for entering the off state; and determining a resistance, for each source-to-drain resistor, sufficiently low to permit a peak voltage, across the first shunt stack, to be sufficiently evenly divided across the first shunt series, when the gates of the first shunt stack receive a signal for entering the off state.

5. The electronic design automation method of claim 1 further comprising:

determining a source-to-drain resistor across each source and drain of each field effect transistor comprising the first pass-through series of field effect transistors of the first pass-through stack;

determining a source-to-drain resistance, for each source-to-drain resistor, approximately the same as the resistance of any other source-to-drain resistor for any other field effect transistor comprising the first pass-through series;

determining a resistance, for each source-to-drain resistor, sufficiently high to permit a necessary level of isolation, for the first pass-through stack, when the gates of the first pass-through stack receive a signal for entering the off state; and determining a resistance, for each source-to-drain resistor, sufficiently low to permit a peak voltage, across the first pass-through stack, to be sufficiently evenly divided, across the first pass-through series, when the gates of the first pass-through stack receive a signal for entering the off state.

6. The electronic design automation method of claim 1 further comprising:

determining a need for power dissipation above that provided by the first shunt stack;

adding in series, between the first shunt stack and the first selectable port, a first inductor;

adding, to the side of the first inductor connected to the first selectable port, a third shunt stack; and balancing, with the first inductor, a parasitic capacitance added by the third shunt stack and the potential of the parasitic capacitance to change transmission line impedance.

7. The electronic design automation method of claim 1 further comprising:

determining a need for power dissipation above that provided by the second shunt stack;

adding in series, between the second shunt stack and the second selectable port, a second inductor;

adding, to the side of the second inductor connected to the second selectable port, a fourth shunt stack; and balancing, with the second inductor, a parasitic capacitance added by the fourth shunt stack and the potential of the parasitic capacitance to change transmission line impedance.

* * * * *